(12) United States Patent
McEathron et al.

(10) Patent No.: US 12,099,387 B2
(45) Date of Patent: Sep. 24, 2024

(54) REDUNDANT COMPUTER COOLING ARCHITECTURE

(71) Applicant: Zoox, Inc., Foster City, CA (US)

(72) Inventors: Carter William McEathron, Redwood City, CA (US); Laura Rose Plaxico, Redwood City, CA (US); Anubhav Thakur, San Francisco, CA (US); Jaime Andres Ocampo Villegas, Foster City, CA (US); Nicholas John Swatko, Foster City, CA (US); Silas Kogure Wilkinson, San Francisco, CA (US)

(73) Assignee: Zoox, Inc., Foster City, CA (US)

( * ) Notice: Subject to any disclaimer, the term of this patent is extended or adjusted under 35 U.S.C. 154(b) by 1132 days.

(21) Appl. No.: 16/691,565

(22) Filed: Nov. 21, 2019

(65) Prior Publication Data
US 2021/0157376 A1 May 27, 2021

(51) Int. Cl.
*G06F 1/20* (2006.01)
*B60H 1/00* (2006.01)
*H05K 7/20* (2006.01)

(52) U.S. Cl.
CPC ......... *G06F 1/206* (2013.01); *B60H 1/00271* (2013.01); *H05K 7/20854* (2013.01); *H05K 7/20872* (2013.01); *H05K 7/20881* (2013.01)

(58) Field of Classification Search
CPC .......... B60H 2001/00307; B60H 1/143; B60H 1/00271
See application file for complete search history.

(56) References Cited

U.S. PATENT DOCUMENTS

| 4,646,202 A | 2/1987 | Hook et al. |
| 5,586,004 A | 12/1996 | Green et al. |
| 5,873,256 A | 2/1999 | Denniston |

(Continued)

FOREIGN PATENT DOCUMENTS

| DE | 102011076737 A1 | 12/2012 |
| WO | 2019194265 A1 | 10/2019 |

OTHER PUBLICATIONS

Office Action for U.S. Appl. No. 16/691,521, mailed Jul. 27, 2022, McEathron, "Vehicle Computer Cooling Architecture", 11 pages.

(Continued)

*Primary Examiner* — Ana M Vazquez
(74) *Attorney, Agent, or Firm* — Lee & Hayes, P.C.

(57) ABSTRACT

A thermal management assembly may implement cooling techniques to cool at least a portion of a computer system with one or more cooling systems. The techniques may include using a thermal management assembly in fluid communication with the cooling system(s) to supply fluid from at least one of the cooling systems to at least a portion of the computer system. The techniques may also or instead include using a first thermal coupling to transfer thermal energy between the first cooling system and the computer system and a second thermal coupling to transfer thermal energy between the second cooling system and the computer system. Cooling a computer system using the cooling techniques described herein lowers an operating temperature of the computer system thereby mitigating heat related computer failure.

20 Claims, 13 Drawing Sheets

(56) References Cited

U.S. PATENT DOCUMENTS

| | | | |
|---|---|---|---|
| 5,914,860 | A | 6/1999 | Janko |
| 6,043,980 | A | 3/2000 | Katsui |
| 6,313,991 | B1 | 11/2001 | Nagashima et al. |
| 6,326,761 | B1 | 12/2001 | Tareilus |
| 6,450,275 | B1 | 9/2002 | Gabriel et al. |
| 6,504,713 | B1 | 1/2003 | Pandolfi et al. |
| 6,651,761 | B1 | 11/2003 | Hrovat et al. |
| 6,665,189 | B1 | 12/2003 | Lebo |
| 6,747,866 | B1 | 6/2004 | Lebo et al. |
| 6,909,607 | B2 | 6/2005 | Radosevich et al. |
| 7,616,443 | B2 | 11/2009 | Walter |
| 7,643,309 | B1 | 1/2010 | Lebo |
| 7,789,176 | B2 * | 9/2010 | Zhou ..................... B60L 58/26 180/65.1 |
| 7,952,856 | B2 | 5/2011 | Otsuka et al. |
| 8,059,404 | B2 | 11/2011 | Miller et al. |
| 8,847,524 | B2 | 9/2014 | Mazumdar |
| 9,638,480 | B1 | 5/2017 | Maranville |
| 9,826,666 | B2 | 11/2017 | France et al. |
| 10,076,058 | B2 | 9/2018 | Niizuma et al. |
| 10,122,237 | B2 | 11/2018 | Hattori et al. |
| 10,314,207 | B1 | 6/2019 | Skalski |
| 10,782,751 | B1 | 9/2020 | Gauthier et al. |
| 2003/0067749 | A1 | 4/2003 | Tamba et al. |
| 2007/0051490 | A1 | 3/2007 | Walter |
| 2008/0117602 | A1 | 5/2008 | Korich et al. |
| 2010/0005822 | A1 | 1/2010 | Bering et al. |
| 2013/0270018 | A1 | 10/2013 | Kim et al. |
| 2014/0245777 | A1 | 9/2014 | Katoh |
| 2016/0107506 | A1 | 4/2016 | Johnston |
| 2016/0120059 | A1 | 4/2016 | Shedd et al. |
| 2016/0183409 | A1 | 6/2016 | Zhou |
| 2016/0229282 | A1 | 8/2016 | Hettrich |
| 2016/0332503 | A1 | 11/2016 | Hirano |
| 2017/0088007 | A1 | 3/2017 | Melendez |
| 2017/0253104 | A1 | 9/2017 | Amano et al. |
| 2018/0272830 | A1 | 9/2018 | Vespa |
| 2018/0281557 | A1 | 10/2018 | Park et al. |
| 2019/0047365 | A1 | 2/2019 | Sonnekalb |
| 2019/0047369 | A1 | 2/2019 | Kim |
| 2019/0070924 | A1 | 3/2019 | Mancini et al. |
| 2019/0171258 | A1 | 6/2019 | Rice |
| 2019/0263223 | A1 | 8/2019 | Durrani et al. |
| 2021/0094383 | A1 | 4/2021 | Vader et al. |
| 2021/0161033 | A1 | 5/2021 | McEathron et al. |

OTHER PUBLICATIONS

Bosch and Mercedes-Benz Research & Development North America, Inc., "Reinventing Safety: A Joint Approach to Automated Driving System," available at least as early as Oct. 10, 2019, 42 pages.

Ford, "A Matter of Trust—Ford's Approach to Developing Self-Driving Vehicles," available at least as early as Oct. 10, 2019, 44 pages.

General Motors, "2018 Self-Driving Safety Report," available at least as early as Oct. 10, 2019, 33 pages.

Nuro, "Delivering Safety: Nuro's Approach," available at least as early as Oct. 10, 2019, 33 pages.

Nvidia, "Self Driving Safty Report 2018," 20 pages.

Office Action for U.S. Appl. No. 16/588,422, mailed on Jul. 27, 2023, Anup Madhav Vader, "Thermal Management Systems and Methods for Vehicles", 17 pages.

Office Action for U.S. Appl. No. 16/588,422, mailed on Oct. 24, 2022, Vader, "Thermal Management Systems and Methods for Vehicles ", 13 pages.

Office Action for U.S. Appl. No. 16/588,422, mailed on Aug. 30, 2021, Vader, "Thermal Management Systems and Methods for Vehicles ", 15 pages.

Extended European Search Report mailed Nov. 22, 2023 for European Application No. 20890934.1, a foreign counterpart to U.S. Pat. No. 11,659,696, 9 pages.

Office Action for U.S. Appl. No. 16/588,422, mailed on Dec. 15, 2023, Anup Madhav Vader, "Thermal Management Systems and Methods for Vehicles", 21 pages.

The PCT Search Report and Written Opinion mailed Jan. 15, 2021 for PCT application No. PCT/US2020/053017, 16 pages.

The PCT Search Report and Written Opinion mailed Mar. 5, 2021 for PCT Application No. PCT/US20/61650, 11 pages.

Bosch and Mercedes-Benz Research & Development North America, Inc., "Reinventing Safety: A Joint Approach to Automated Driving System," available at least as eary as Oct. 10, 2019, 42 pages.

Ford, "A Matter of Trust—Ford's Approach to Developing Self-Driving Vehicles," available at least as eary as Oct. 10, 2019, 44 pages.

General Motors, "2018 Self-Driving Safety Report," available at least as eary as Oct. 10, 2019, 33 pages.

Nuro, "Delivering Safety: Nuro's Approach," available at least as eary as Oct. 10, 2019, 33 pages.

Nvidia, "Self Driving Safty Report 2018," Retrieved on Nov. 19, 2019, from https://www.nvidia.com/content/dam/en-zz/Solutions/self-driving-cars/safety-report/NVIDIA-Self-Driving-Safety-Report-2018.pdf , 20 pages.

Uber ATG, "Uber Advanced Technologies Group, A Principled Approach to Safety," V01, 2018, 70 pages.

Waymo LLC, "Waymo Fully Self-Driving Chrysler Pacifica Emergency Response Guide and Law Enforecement Interaction Protocol," Includes material from the FCA 2017 Pacifica Hybrid Emergency Response Guide, 2018, Updated Sep. 10, 2018, 36 pages.

Zoox, "Safety Innovation at Zoox—Setting the Bar for Safety in Antonomous Mobility," Version 1.0, Published 2018, 30 pages.

Office Action for U.S. Appl. No. 16/588,422, mailed on Mar. 16, 2022, Vader, "Thermal Management Systems and Methods for Vehicles ", 12 Pages.

Office Action for U.S. Appl. No. 16/691,521, mailed on Apr. 11, 2022, McEathron, "Vehicle Computer Cooling Architecture", 9 Pages.

The International Preliminary Report on Patentability for PCT Application No. PCT/US20/53017, mailed Apr. 14, 2022.

* cited by examiner

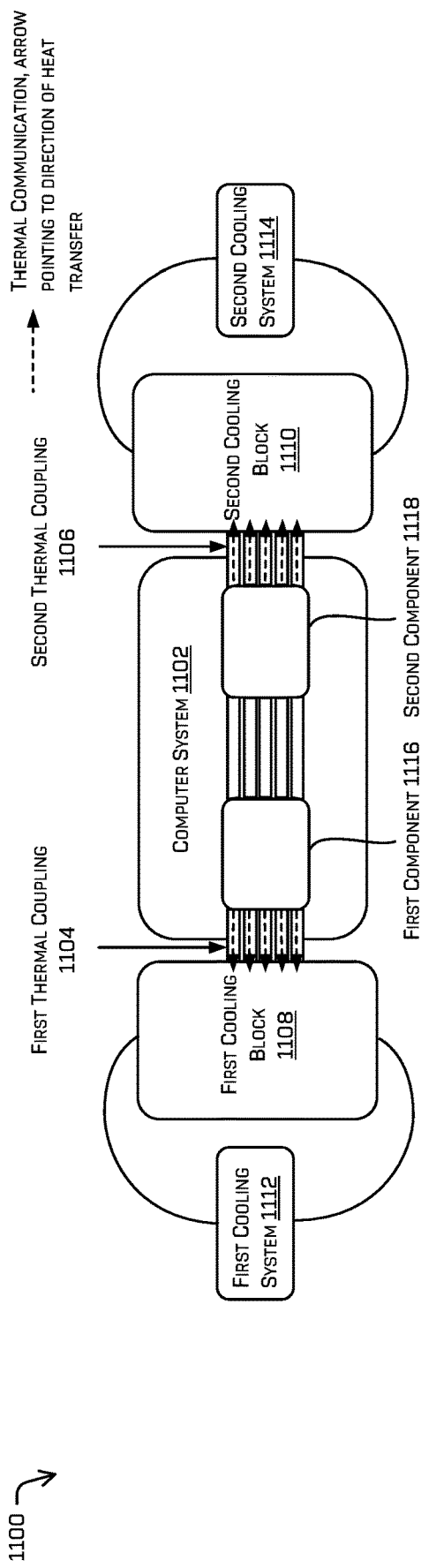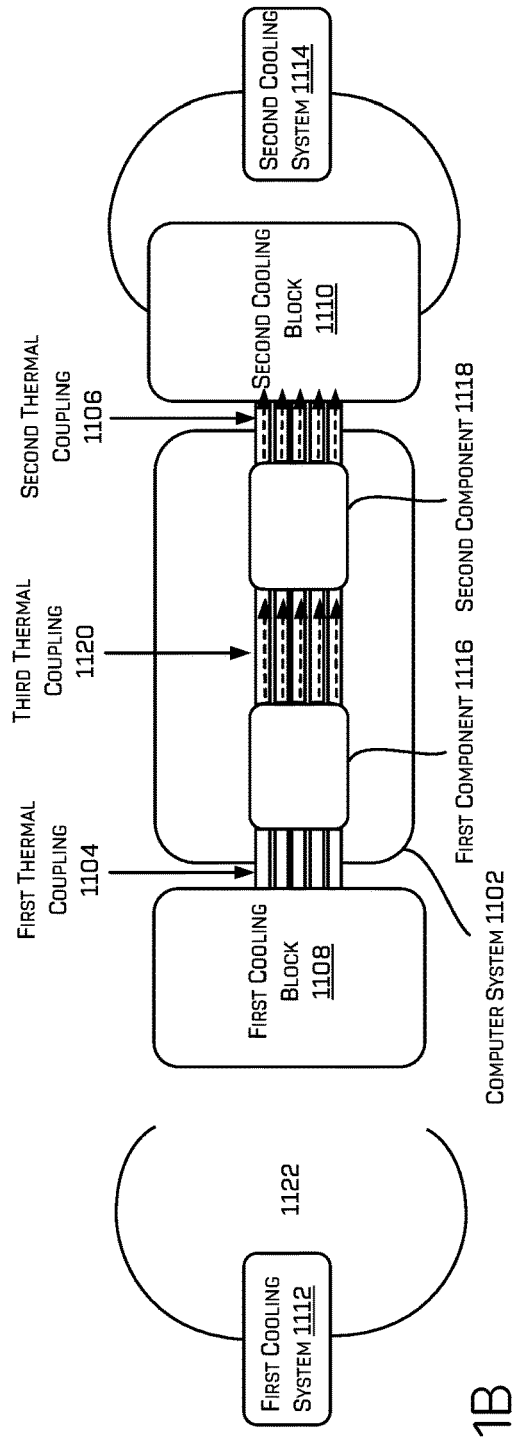
FIG. 11A
FIG. 11B

REDUNDANT COMPUTER COOLING ARCHITECTURE

BACKGROUND

Computers generate heat during operation and may require cooling to remain operational for extended periods of time. In addition, heat generated from the computer may become trapped in an area in which the computer operates. For instance, a computer located in a vehicle may generate sufficient amounts of heat to render air cooling ineffective. In a semi-autonomous vehicle and/or an autonomous vehicle, the computer may control aspects of the vehicle that would be lost if the computer shuts down due to heat.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

FIGS. 11A and 11B are illustrations of an example thermal management assembly inside an example computer system.

DETAILED DESCRIPTION

Figure 1:
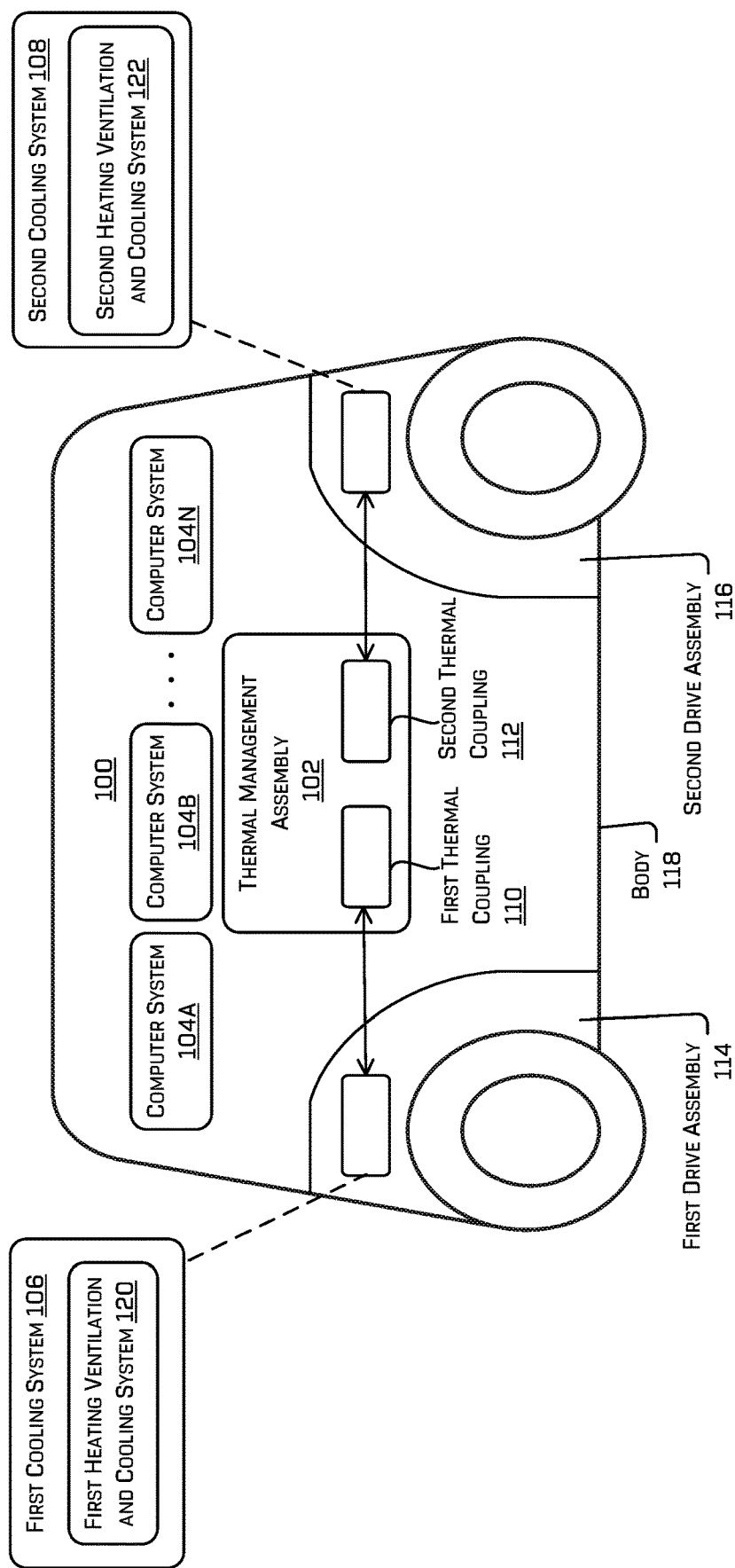
FIG. 1 is a schematic diagram of an example vehicle, in which an example thermal management assembly cools one or more computer systems of the vehicle.

Modern vehicles include one or more computer systems to control aspects of operation. As these computer systems become more powerful, as in the case of semi-autonomous or autonomous vehicles for example, the amount of heat generated by these computing systems can be considerable. The vehicle may also include a heating ventilation and air conditioning (HVAC) system for controlling the temperature and/or humidity inside an occupant compartment of the vehicle for the comfort of the occupant (e.g., a passenger). In a semi-autonomous vehicle and/or an autonomous vehicle, the computer may control aspects of the vehicle that would be lost if the computer shuts down due to heat.

This application describes techniques for cooling at least a portion of a computer system with fluid from a cooling system. A thermal management assembly in fluid communication with a first cooling system and a second cooling system is coupled to the computer system to supply fluid from at least one of the first cooling system or the second cooling system to the computer system. In some examples, the thermal management assembly comprises a first thermal coupling to transfer thermal energy between the first cooling system and the computer system and further comprises a second thermal coupling to transfer thermal energy between the second cooling system and the computer system. In various examples, the first thermal coupling may comprise a first heat pipe or a first fluid circuit and the second thermal coupling may comprise a second heat pipe or a second fluid circuit to cool the computer system. By including two cooling systems, at least one cooling system is available to cool the computer system when another of the cooling systems is inoperable.

In some examples, the first cooling system may be coupled to (e.g. attached at least partially within) a first drive assembly while the second cooling system may be coupled to a second drive assembly. In various examples, each of the first drive assembly and the second drive assembly may be detachably coupled to a body of a vehicle. Cooling a computer system with fluid from the first cooling system and/or the second cooling system as described herein lowers an operating temperature of the computer system thereby mitigating heat related computer failure.

In various examples, the thermal management assembly may be configured to supply fluid from the first cooling system (e.g., a first heating ventilation and air condition system of the vehicle) and/or the second cooling system (e.g., a second heating ventilation and air condition system of the vehicle) to at least a portion of the computer system. Each of the first cooling system and the second cooling system generally represents one or more components that remove heat from a liquid by a vapor-compression cycle and/or an absorption refrigeration cycle. In examples when the first cooling system and the second cooling system are part of an autonomous vehicle, managing heat within a housing of the computer system using the cooling techniques described herein contributes to safe operation of the autonomous vehicle by achieving and/or maintaining a desired temperature associated with the computer system.

As previously mentioned, in some examples, the first thermal coupling may comprise a first heat pipe or a first fluid circuit while the second thermal coupling may comprise a second heat pipe or a second fluid circuit. In some examples, the first thermal coupling and/or the second thermal coupling may comprise multiple heat pipes, multiple fluid circuits, or a combination of heat pipes and fluid circuits. In some examples, the first heat pipe may be different than the second heat pipe while in other examples a single heat pipe may extend from the first cooling system to the second cooling system. In addition, or in the alternative, the first fluid circuit may be different than the second fluid circuit while in other examples the first fluid circuit may be in fluid communication (e.g., exchange fluid) with the second fluid circuit. An example heat pipe may comprise a vapor filled metal pipe (e.g., copper or aluminum pipe)

that, by proximity to a component of the computer system, cools the component by moving heat from a first portion of the heat pipe near the component to a second portion of the heat pipe adjacent to a cooling block. In some examples, the second portion of the heat pipe may be located adjacent to the first cooling system and/or the second cooling system to cool the vapor inside the heat pipe.

In various examples, a first fluid from the first cooling system and/or a second fluid from the second cooling system of the vehicle is supplied to the thermal management assembly via the first thermal coupling and/or the second thermal coupling. The first thermal coupling and the second thermal coupling may, in some examples, be configured to transfer heat captured by the first thermal coupling and/or the second thermal coupling to the first cooling system or the second cooling system. Thus, in some examples, the first thermal coupling and the second thermal coupling may be configured to establish, maintain, and/or disconnect thermal communication (e.g., when heat pipes are used) and/or fluid communication (e.g., when a fluid circuit is used) with the first cooling system and/or the second cooling system. In some examples, the first thermal coupling and the second thermal coupling represent interfaces (e.g., a fluid interface and/or a thermal interface) and/or connectors (e.g., a quick-connect connector) that enable safe thermal connection/disconnection between one of the cooling systems and the thermal management assembly.

In some examples, the thermal management assembly is in fluid communication with the first cooling system and the second cooling system to cool the computer system using both the first fluid and the second fluid (e.g., both the first cooling system and the second cooling system are operational). In other examples, the thermal management assembly is in fluid communication with one of the first cooling system or the second cooling system to cool the computer system using either the first fluid or the second fluid (e.g., the first cooling system cools the computer system when the second cooling system is inoperable).

In some examples, the thermal management assembly may comprise a first cooling block associated with a first component of the computer system, and a second cooling block associated with a second component of the computer system. In such examples, the second component of the computer system may be different from the first component of the computer system. The first cooling block and/or the second cooling block may be cooled with the first fluid of the first cooling system, the second fluid of the second cooling system, and/or the first fluid of the first cooling system and the second fluid of the second cooling system. In various examples, a location of the first cooling block or the second cooling block may be at least one of: inside a housing of the computer system, outside the housing of the computer system, or inside a drive assembly of a vehicle, just to name a few.

In some examples, either of the first component of the computer system or the second component of the computer system may comprise one of: a central processor unit (CPU), a graphics processing unit (GPU), a voltage regulator, an ethernet controller, a chipset, a solid-state drive, a power supply, a memory device, an image processing unit, a network interface card, and so on. Generally, the first cooling block may absorb heat from the first component and the second cooling block may absorb heat from the second component. In non-limiting examples, a cooling block may absorb heat from one or more components of the computer system, a thermal coupling proximate to the cooling block absorbs the heat from the cooling block (or directly from the one or more components) and transfers the heat to one or more cooling systems for cooling. In some examples, the thermal coupling comprises a fluid circuit that enables fluid to flow between the cooling block and the cooling system. In some examples, the thermal coupling comprises a heat pipe that enables heat to transfer from the one or more components to an exterior surface of the heat pipe and/or to an inside of the heat pipe (e.g., transfer vapor within the heat pipe).

The thermal management assembly may, in various examples, receive fresh fluid (e.g., cool coolant) from the first cooling system and/or the second cooling system and transfer used fluid (e.g., warm coolant) to the first cooling system and/or the second cooling system for cooling. In some examples, the thermal management assembly may be part of a closed-loop system that exchanges the used fluid for the fresh fluid to enable continuous cooling of the computer system. By continuously cooling the computer system, temperatures associated with the computer system can be managed more efficiently. Further, the thermal management assembly targets specific areas within the computer system to cool which leads to lower temperatures in and around the computer system as compared to not targeting specific areas.

As mentioned above, in some examples, the thermal management assembly may be part of a closed-loop system that transfers fluid between the first cooling system and/or the second cooling system and a computer system. In some examples, the thermal management assembly may transfer fluid between the first cooling system and/or the second cooling system and multiple cooling blocks in parallel to cool multiple components of the computer system at a first time. The thermal management assembly may also or instead transfer fluid between the first cooling system and/or the second cooling system and a cooling block in series to cool a component of the computer system at a second time.

The techniques discussed herein may improve a functioning of a computer system by limiting heat related failures. In some examples, fluid from a cooling system cools components of a computer system that generate heat via one or more of: a cooling block, a manifold, a cooling system, a heatsink, and one or more heat pipes. In some examples, the manifold may be coupled to a portion of a housing of the computer system to improve rigidity among two portions of the housing. Additionally or alternatively, the manifold may be coupled to a portion of a cooling block and/or component of the computer system to improve rigidity among the cooling block and/or the component. In some examples, the first cooling system and/or the second cooling system may cool components of a computer system that generate heat via the first thermal coupling and/or the second thermal coupling. As a result, the computer system can improve tolerance to shock, vibration, and other environmental conditions in which the computer system operates.

The techniques discussed herein may also improve a functioning of a vehicle or machine that depends on a computer system for operation. For instance, cooling a computer system using the techniques described herein enables a computer system (e.g., a vehicle computer system, a machine vision computer system, and the like) to provide functionality regardless of an environment in which the computer is located and regardless of whether one of the two cooling systems fails. In some examples, the thermal management assembly may cool a computer system in a hot climate (e.g., an area having an ambient temperature above the dew point) and/or mounted in an enclosed space (e.g., within a sealed housing, inside a body of a vehicle, and/or an area with little to no air movement). In addition to improving performance of a computer system in various environments, implementing the cooling techniques described herein enable the use of more sophisticated computational resources (e.g., a processor unit that performs greater number of computations, more processors, more components, etc.) to improve functioning and performance of the computer system.

The techniques described herein may be implemented in a number of ways. Example implementations are provided below with reference to the following figures. Although discussed in the context of an autonomous vehicle, the methods, apparatuses, and systems described herein may be applied to a variety of systems (e.g., a manually driven vehicle, a sensor system, or a robotic platform), and are not limited to autonomous vehicles. In another example, the techniques may be utilized in an aviation or nautical context, or in any system using machine vision (e.g., in a system using image data).

FIG. 1 is an illustration of an example vehicle 100, in which an example thermal management assembly 102 cools a computer system 104A, 104B, up to an Nth computer system 104N (collectively "computer systems 104"), where N can be any integer greater than or equal to 1. While described as a separate system, in some examples, the thermal management techniques described herein may be implemented by other vehicle systems, components, and/or computing devices. For example, and as will be described in further detail with regard to FIG. 14, thermal management techniques described herein may be implemented at least partially by or in association with a thermal management assembly 1430 comprising one or more manifolds, cooling blocks, heatsinks, heat pipes, and/or fluid circuits.

In various examples, a first cooling system 106 and/or a second cooling system 108 of the vehicle 100 may cool at least a portion of one or more of the computer systems 104 of the vehicle 100. In some examples, a first fluid from the first cooling system 106 and/or a second fluid from the second cooling system 108 of the vehicle 100 is supplied to the thermal management assembly 102 via a first thermal coupling 110 and/or a second thermal coupling 112. In some examples, the first cooling system 106 may be coupled to (e.g. attached at least partially within) a first drive assembly 114 while the second cooling system 108 may be coupled to a second drive assembly 116. In various examples, each of the first drive assembly 114 and the second drive assembly 116 may be detachably coupled to a body 118 of the vehicle 100.

Generally, the thermal management assembly 102 is configured to cool one or more of the computer systems 104 by transferring thermal energy from one or more of the computer systems 104 to the first cooling system 106 and/or the second cooling system 108. In some examples, the first thermal coupling 110 and/or the second thermal coupling 112 may comprise one or more a heat pipes and/or fluid circuits to transfer thermal energy away from the one or more computer systems 104 and to at least one of the first cooling system 106 or the second cooling system 108. Thus, the first thermal coupling 110 and the second thermal coupling 112 may be configured to establish, maintain, and/or disconnect thermal communication (e.g., when heat pipes are used) and/or fluid communication (e.g., when a fluid circuit is used) with the first cooling system 106 coupled to the first drive assembly 114 and/or the second cooling system 108 coupled to the second drive assembly 116.

In various examples, the thermal management assembly 102 may be supplied fluid from one or both of the first cooling system 106 and the second cooling system 108 to one or more of the computer systems 104 via the first thermal coupling 110 and/or the second thermal coupling 112. In some examples, the thermal management assembly 102 is in fluid communication with the first cooling system 106 and the second cooling system 108 to cool the one or more computer systems 104 using both the first fluid and the second fluid. In other examples, such as in the case of failure of one of the cooling systems, the thermal management assembly 102 is in fluid communication with one of the first cooling system 106 or the second cooling system 108 to cool the one or more computer systems 104 using either the first fluid or the second fluid. In some examples, the first fluid from the first cooling system 106 and the second fluid from the second cooling system 108 are closed systems isolated from each other, while in other examples the first fluid from the first cooling system 106 and the second fluid from the second cooling system 108 may be shared (i.e., the cooling systems may be in fluid communication with each other).

In some examples, substantially all major systems of the vehicle 100 may be located on each of the first drive assembly 114 and the second drive assembly 116. For instance, each of the first drive assembly 114 and the second drive assembly 116 may include some or all of the following: a propulsion system, power supply system and related electronics, steering system, braking system, suspension system, heating ventilation and air conditioning (HVAC) system, and related controls and actuators for the forgoing systems. For instance, the first cooling system 106 may comprise a first HVAC system 120 and the second cooling system 108 may comprise a second HVAC system 122. In various examples, the first drive assembly 114 and the second drive assembly 116 are configured to individually detach from the body 118 of the vehicle 100. In some examples, the first thermal coupling 110 and the second thermal coupling 112 represent interfaces and/or connectors that enable safe thermal connection/disconnection between a respective cooling system and the thermal management assembly 102. In this way, one of the first drive assembly 114 or the second drive assembly 116 may be detached from the body of the vehicle 100 without interrupting fluid communication within the thermal management assembly.

Figure 2:
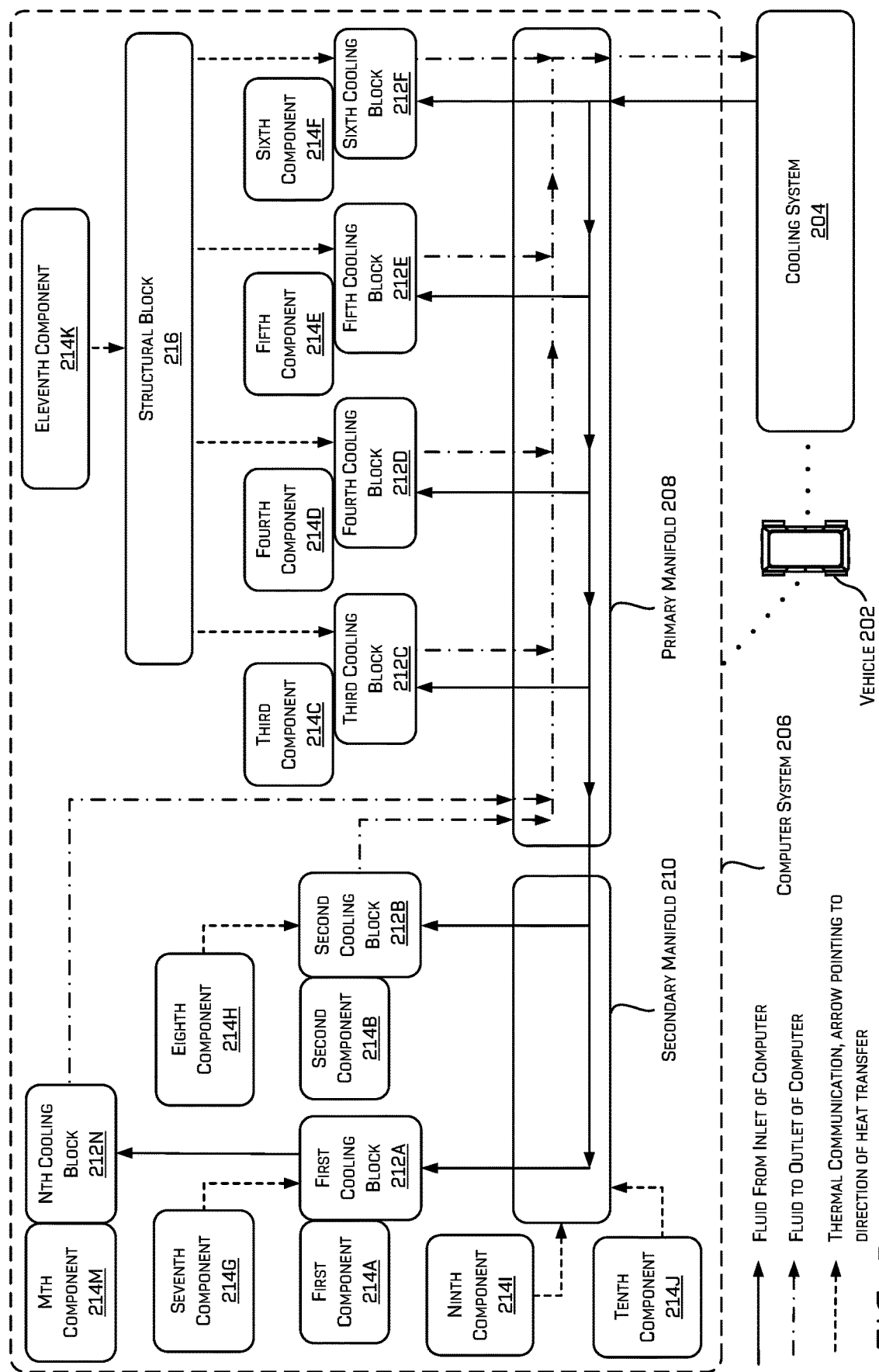
FIG. 2 is a block diagram of another example vehicle, in which an example thermal management assembly cools a computer system of the vehicle.

FIG. 2 is a block diagram of another example vehicle 202, in which an example thermal management assembly cools a computer system of the vehicle 202. While described as a separate system, in some examples, the thermal management techniques described herein may be implemented by other vehicle systems, components, and/or computing devices. For example, and as will be described in further detail with regard to FIG. 14, thermal management techniques described herein may be implemented at least partially by or in association with a thermal management assembly 1430 comprising one or more manifolds, cooling blocks, heatsinks, heat pipes, and/or fluid circuits.

In various examples, a cooling system 204 of the vehicle 202 may cool at least a portion of a computer system 206 of the vehicle 202. In some examples, the cooling system 204 may comprise an HVAC system of the vehicle 202. In some examples, fluid from the cooling system 204 of the vehicle 202 is supplied to a primary manifold 208 for delivery to a secondary manifold 210 and/or one or more cooling blocks 212. In this example, the cooling system 204 includes a first cooling block 212A, a second cooling block 212B, up to an Nth cooling block 212N (collectively "cooling blocks 212"), where N can be any integer greater than or equal to 1. The cooling blocks 212 may be used to cool components 214 of the computer system 206. In the illustrated example, the computer system includes a first component 214A, a second component 214B, up to an Mth component 214M (collectively "components 214"), where M can be any integer greater than or equal to 1. In some examples, the number of components M may not be the same as the number of cooling blocks N.

In some examples, the fluid (e.g., vehicle coolant) of the cooling system 204 is supplied to the primary manifold 208 via a fluid circuit (e.g., a conduit) and flows within a portion of the primary manifold 208 to openings that transfer the fluid to the secondary manifold 210 and/or the cooling blocks 212C, 212D, 212E, and 212F. In some examples, the primary manifold 208 may transfer the fluid to the secondary manifold 210 and/or the cooling blocks 212 either by way of one or more conduits and/or by transferring the fluid directly to openings associated with the secondary manifold 210 and/or the cooling blocks 212C, 212D, 212E, and 212F (e.g., without using a conduit). In some examples, the cooling system 204 may receive used/warm fluid (e.g., fluid that has passed through a manifold and/or a cooling block) from the primary manifold 208, may cool the fluid, and may return the cooled fluid to the primary manifold 208 as fresh fluid (e.g., cool coolant).

In some examples, the primary manifold 208 may be configured to receive the fluid from the cooling blocks 212C, 212D, 212E, and 212F, and transfer the fluid to the cooling system 204 to cool the fluid. In such examples, the primary manifold 208 is part of a closed loop system that includes at least the cooling system 204 and the cooling blocks 212. In some examples, the primary manifold 208 may direct fluid from the cooling system 204 to multiple cooling blocks (e.g., cooling blocks 212C, 212D, 212E, and 212F) in parallel to supply fluid at a first temperature to each of the multiple cooling blocks at substantially a same time and without first passing through another of the multiple cooling blocks.

In some examples, the primary manifold 208 may transfer fluid to a fluid circuit (e.g., a conduit) coupled to an additional cooling block (not shown) and/or an additional manifold (not shown). For instance, the primary manifold 208 may use the fluid circuit to transfer the fluid to the additional cooling block and/or the additional manifold.

In some examples, the primary manifold 208, the secondary manifold 210, and/or the cooling blocks 212 may be coupled to and/or be proximate to one or more of the components 214. For instance, any of the components 214 may comprise any one of: a central processor unit, a graphics processing unit, a voltage regulator, an ethernet controller, a chipset, a solid-state drive, a power supply, a memory device, an image processing unit, or a network interface card, and so on. As illustrated in FIG. 2, the components 214G, 214H, 214I, 214J, and 214K are associated with thermal communication (e.g., heat transfer using a heatsink, the primary manifold, the secondary manifold, and/or heat pipes) while the components 214A, 214B, 214C, 214D, 214E, 214F, and 214M are associated with respective cooling blocks 212 which are in fluid communication (e.g., a flow of fluid) with the cooling system 204. In addition, or in the alternative, one or more components 214 (e.g., the tenth component 214J) may be coupled to a structural block 216. In some examples, the structural block 216 may be configured to cool the one or more components 214 of the computer system 206 (e.g., by transferring heat through contact with at least one of the primary manifold 208 or the secondary manifold 210). As described below, the structural block 216 may be configured to provide rigidity to a housing of the computer system 206 and/or one or more component 214 of the computer system 206.

In various examples, the primary manifold 208 and/or the secondary manifold 210 may comprise one or more portions that cool the components 214 of the computer system 206 located near or in contact with the primary manifold 208 and/or the secondary manifold 210. For instance, the primary manifold 208 and/or the secondary manifold 210 may comprise metal (e.g., aluminum, magnesium, copper, an alloy, a combination thereof, and so on) to facilitate heat transfer between the fluid and the primary manifold 208 and/or the secondary manifold 210. The one or more portions of the primary manifold 208 and/or the secondary manifold 210 may also or instead cool an ambient temperature within the housing of the computer. In some examples, the primary manifold 208 and the secondary manifold 210 may comprise a single manifold (e.g., a manifold manufactured as a single unit).

In various examples, the thermal management assembly may comprise a heatsink (not shown) located between at least one of the primary manifold 208 or the secondary manifold 210 and an associated component (e.g., components 214G, 214H, 214I, 214J, and 214K) to provide thermal cooling of the respective component of the computer system 206. Generally, the heatsink is configured to transfer heat from some of the components 214 of the computer system 206 to at least one of: the primary manifold 208, the secondary manifold 210, and a housing of the computer system 206. As depicted in FIG. 2, the eleventh component 214K (e.g., a solid-state hard drive or other solid-state device) may, in some examples, be thermally connected to the structural block 216 via a heatsink which in turn is thermally connected to the primary manifold 208. In various examples, the eleventh component 214K may be thermally connected to the housing of the computer system to direct heat from the eleventh component 214K to the housing.

In some examples, the heatsink may be configured to extend from a portion of a cooling block and/or manifold to a component of the computer system 206. For instance, the secondary manifold 210 may connect to the component 214I (e.g., a memory device such as dynamic random-access memory) and the tenth component 214J (e.g., a network interface card) via a first heatsink and a second heatsink, respectively. In some examples, the first heatsink may be between the secondary manifold 210 and the tenth component 214I and the second heatsink may be between the secondary manifold 210 and the tenth component 214J.

In still further examples, the heatsink may be coupled to a component of the computer system 206 that is also coupled to one of the primary manifold 208 or the secondary manifold 210 (e.g., a component having a first portion coupled to a manifold and a second portion coupled to the heatsink). For example, the ninth component 214I may be coupled to the secondary manifold 210 and also be coupled to a heatsink at an end opposite the secondary manifold 210. In some examples, heat from a first portion of ninth component 214I may be transferred to the heatsink and heat from a second portion of ninth component 214I may be transferred to the primary manifold 208 (e.g., independent of the heatsink being coupled directly to the primary manifold 208). Thus, in some examples, the heatsink may cool a first portion of one of the components 214 while the primary manifold 208 or the secondary manifold 210 may cool a second portion of one of the components 214.

As shown in FIG. 2, the secondary manifold 210 may be configured to transfer fluid to cooling blocks 212A and 212B, though more or fewer cooling blocks may be used with the secondary manifold 210 in other examples. Additionally, or alternatively, the secondary manifold 210 may be configured to attract heat from components 214I and 214J of the computer system 206. Here, the components 214I and 214J may be thermally connected to the secondary manifold 210 through physical contact for cooling via the one or more portions of the secondary manifold 210. As illustrated, unlike the primary manifold 208 which receives fluid from the cooling blocks 212C, 212D, 212E, and 212F, in some examples the secondary manifold 210 delivers fluid to cooling block 212A and 212B without receiving the fluid back from the cooling blocks 212A and 212B. In some examples, fluid flows through the cooling block 212A to a cooling block 212N and fluid also flows from the cooling block 212B to the primary manifold 208. In various examples, the cooling block 212N may be associated with a component 214M (e.g., a power supply) of the computer system 206.

Generally, fluid enters the computer system 206 at the primary manifold 208 at a first temperature and increases in temperature as the fluid comes in contact with the secondary manifold 210 and/or the cooling blocks 212. Thus, fluid exits the computer system 206 at the primary manifold 208 at a second temperature that is different from the first temperature. For this reason, fluid flowing through the fifth cooling block 212N may be at a higher temperature compared to a temperature of the fluid flowing through the primary manifold 208. By distributing fluid as described herein, cool fluid reaches the components generating the most heat first and then transfers the fluid to components that generally require less cooling. For example, a temperature of fluid at the cooling block 212N may be warmer than a temperature of fluid at the cooling block 212C. Accordingly, the component 214M (e.g., a power supply) may be cooled with warmer fluid than the component 214C (e.g., a graphic processing unit).

FIG. 2 also depicts a thermal connection between the seventh component 214G and (e.g., a first voltage regulator) cooling block 214A and the eight component 214H and cooling block 212B (e.g., a second voltage regulator). Each of the component 214G and the component 214H may be cooled based at least in part on a proximity to the respective cooling block (e.g., the cooling blocks 212A and 212B) which absorbs thermal energy emitted from the component 214G and the component 214H. By way of example and not limitation, a heatsink may also extend from one of the cooling block 212A or the cooling block 212B to at least one of the component 214G or the component 214H.

Additionally, FIG. 2 illustrates thermal communication between the cooling blocks 212C, 212D, 212E, and 212F and the structural block 216. Here, the structural block 216 (e.g., a block of aluminum, magnesium, or copper) may have slots for coupling to at least a portion of the cooling blocks 212C, 212D, 212E, and 212F to secure one of the cooling blocks 212C, 212D, 212E, and 212F relative to a housing of the computer system 206 and/or relative to another of the cooling blocks 212C, 212D, 212E, and 212F. By way of example and not limitation, the structural block 216 may comprise a heat-conductive metal plate with slots for receiving multiple cooling blocks (e.g., cooling blocks 212C, 212D, 212E, and 212F).

In some examples, the structural block 216 may be configured to cool the component 214J of the computer system 206. Here, the component 214J may be cooled by the structural block 216 which in turn is cooled by one or more of the cooling blocks 212C, 212D, 212E, and 212F. In some examples, the structural block 216 may be coupled to, and cooled by, the primary manifold 208. In some examples, the structural block 216 may be coupled to a heatsink that draws heat from the structural block 216 to the primary manifold 208, the cooling blocks 212C, 212D, 212E, and 212F, and/or a housing of the computer system 206. By way of example and not limitation, the heatsink may be coupled to a chipset of the computer system 206, though other components may also be cooled by the heatsink. In this way, the thermal management assembly may be configured to cool the computer system 206 with both liquid cooled elements (e.g. the cooling blocks) as well as thermal cooling.

In various examples, the cooling blocks 212 may be associated with two or more components of the computer system 206. For instance, each of the cooling blocks 212 may be associated with two or more graphics processing units. In some examples, the one or more graphics processing units may be mounted to different cooling blocks 212 via a printed circuit board. In some examples, the cooling blocks 212A and 212B may be associated with respective central processing units. In some examples, a component may be associated with a cooling block and/or manifold of the computer system 206 based at least in part on an amount of heat each component generates. Given that an amount of heat generated by the one or more graphics processing units during operation is typically greater than an amount of heat generated by the one or more central processing units, the one or more graphics processing units are associated with the primary manifold 208 via the cooling blocks 212C, 212D, 212E, and 212F to receive cooler fluid than the fluid feeding the cooling blocks 212A and 212B that cool the one or more central processing units. Thus, in some examples, components may be associated with a cooling block and/or manifold of the computer system based at least in part on an amount of heat each component generates.

As mentioned above, fluid from the cooling system 204 typically heat up as the fluid passes through and/or around different heat-generating components of the computer system 206. For this reason, a component requiring more cooling (e.g., a component that uses more power than another component) may be located closer to the source of cool fluid while a component requiring less cooling (e.g., a component that uses less power than another component) may be located further from the source of cool liquid. Additionally, or in the alternative, one or more components that generate heat during operation may be cooled by thermal connections (e.g., a heatsink, a heat pipe, heat tape, thermal grease, and the like), the primary manifold 208, and/or the secondary manifold 210.

Figure 3:
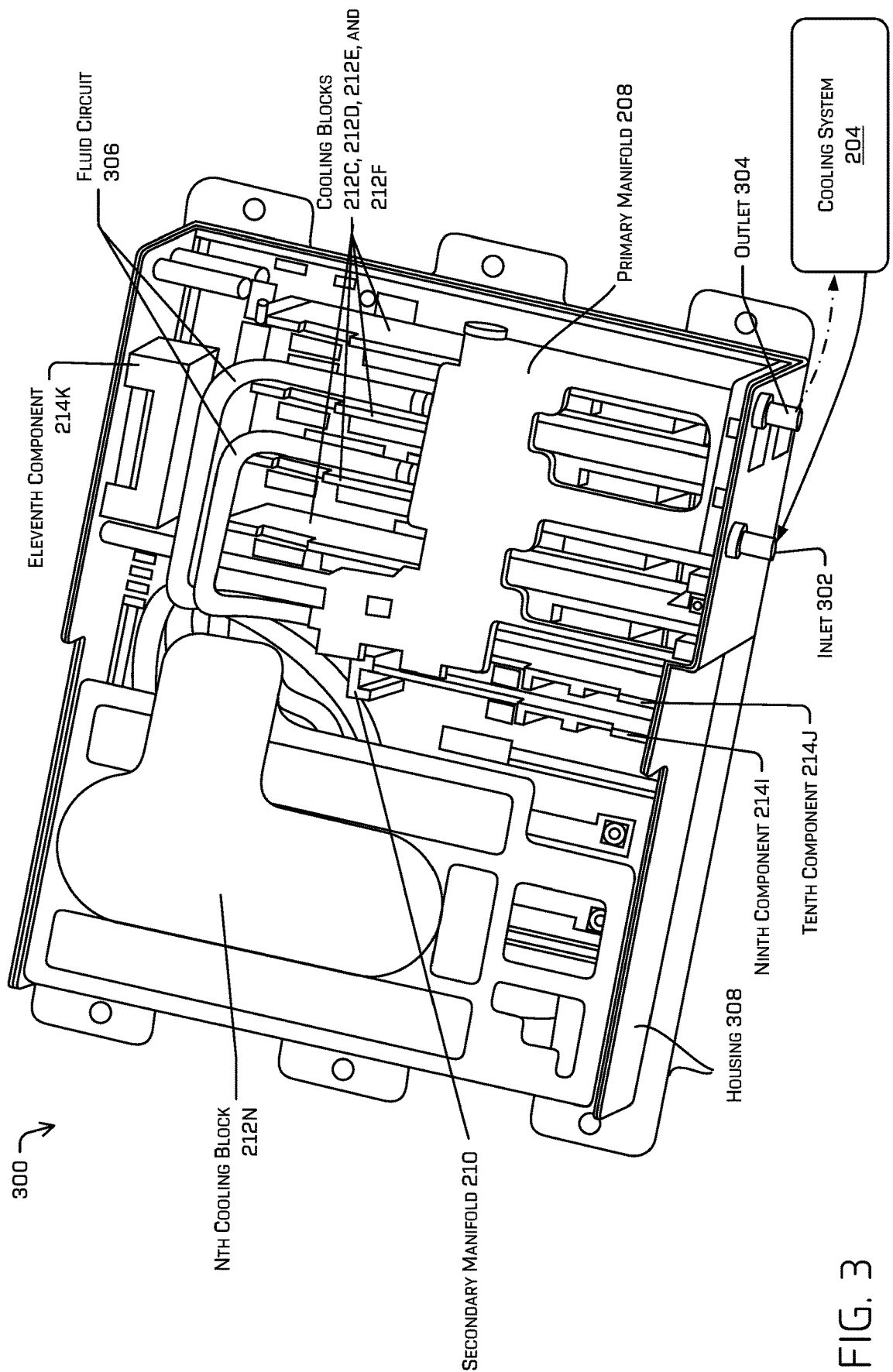
FIG. 3 is an illustration of an example computer system and an example thermal management assembly.

FIG. 3 is an illustration of an example computer system 300 showing a thermal management assembly. In some examples, the thermal management assembly may comprise an inlet 302 and an outlet 304 for transferring fluid between the computer system 300 and the cooling system 204. In various examples, the inlet 302 and/or the outlet 304 connect directly to the primary manifold 208 through a faceplate of one of the computer systems 104. In some examples, the inlet 302 and/or the outlet 304 may represent a quick-connector to enable the cooling system 204 to connect to and disconnect from the computer system 206. As illustrated in FIG. 3, the thermal management assembly may comprise the primary manifold 208, the secondary manifold 210, the cooling blocks 212C, 212D, 212E, and 212F, the components 214I, 214J, and 214K, and a fluid circuit 306. The fluid circuit 306 may generally represent one or more conduits usable to transfer fluid among the cooling system 204, the primary manifold 208, the secondary manifold 210, and/or the cooling blocks 212.

Figure 4A:
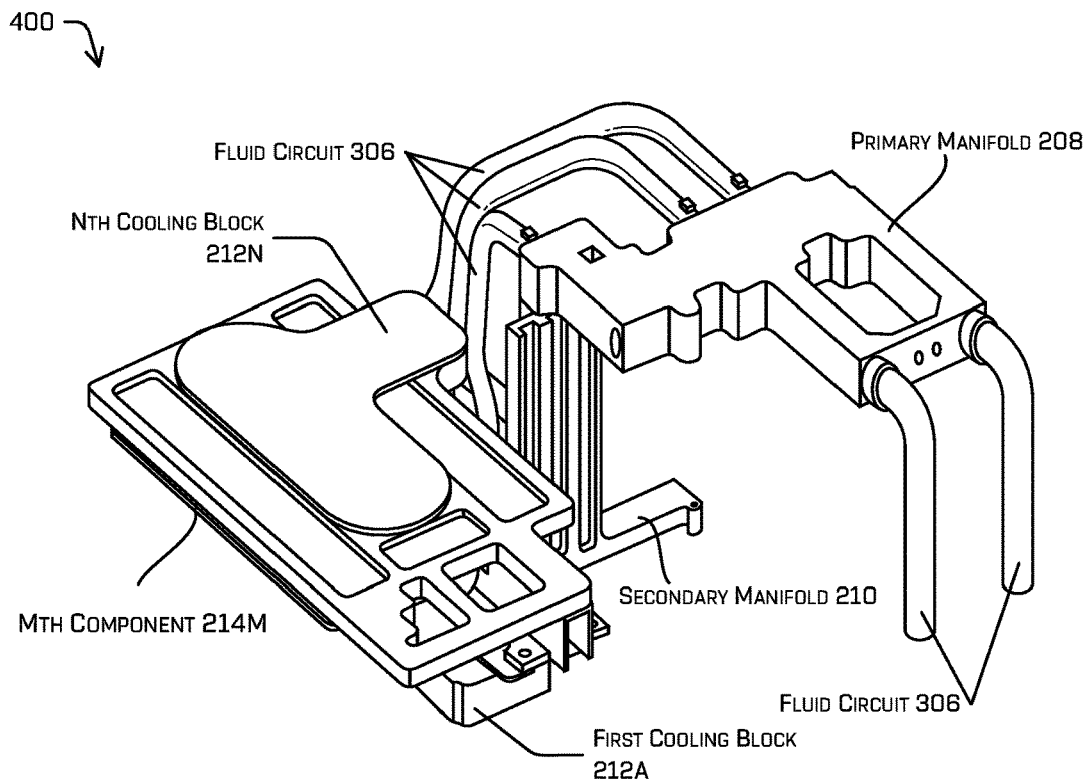
FIGS. 4A and 4B are perspective views of the example thermal management assembly of FIG. 3.
Figure 4B:
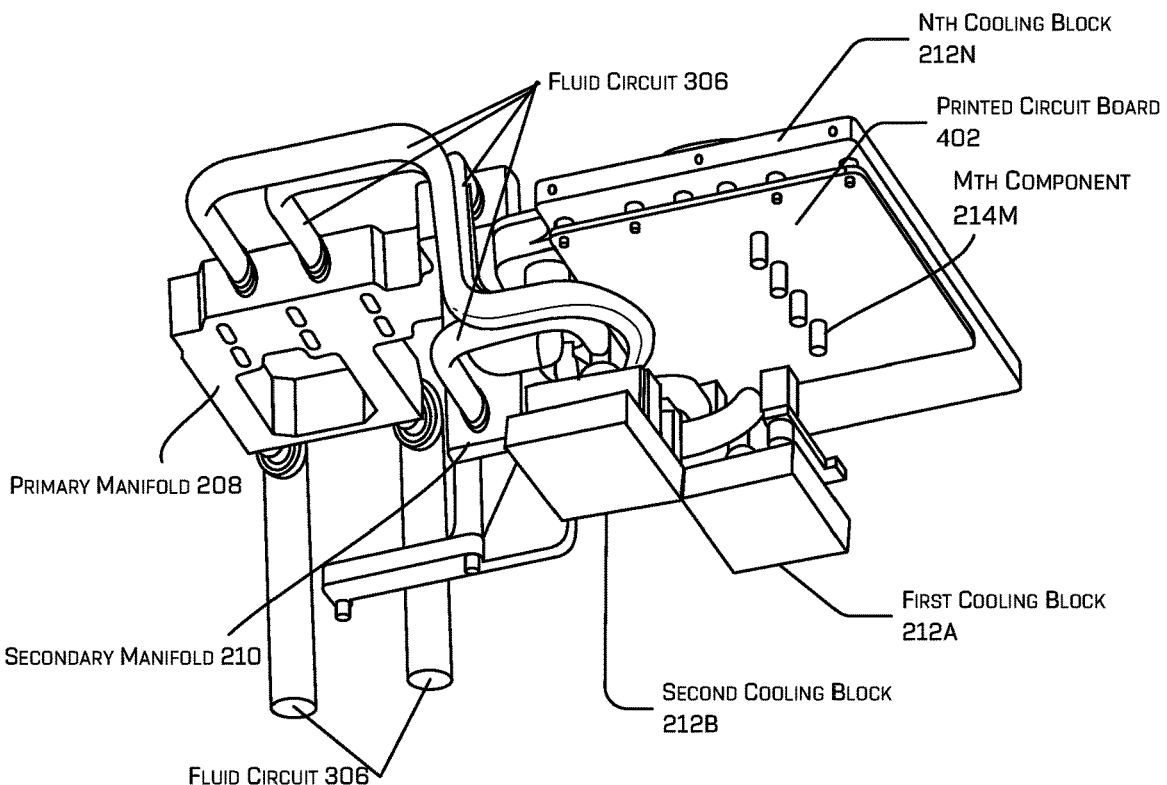

FIGS. 4A and 4B are perspective views of an example thermal management assembly 400 to cool an example computer system (e.g., computer system 206 and/or vehicle computer system 1404). While described as a separate system, in some examples, the thermal management techniques described herein may be implemented by other vehicle systems, components, and/or computing devices. For example, and as will be described in further detail with regard to FIG. 14, thermal management techniques described herein may be implemented at least partially by or in association with a thermal management assembly 1430 comprising one or more manifolds, cooling blocks, heatsinks, heat pipes, and/or fluid circuits.

As shown in FIGS. 4A and 4B, the thermal management assembly 400 comprises a primary manifold 208, a secondary manifold 210, cooling blocks 212A, 212B, and 212N, component 214M, fluid circuit 306, and printed circuit board 402. In various examples, the fluid circuit 306 (e.g., tubing that enable flow of liquid) may transfer the fluid among the cooling system 204, the primary manifold 208, the secondary manifold 210, and/or the cooling blocks 212. In some examples, the fluid circuit 306 may be configured to transfer fluid from the cooling system 204 to the primary manifold 208. Additionally or in the alternative, the fluid circuit 306 may be configured to transfer fluid from the secondary manifold 210 to the cooling blocks 212A and 212B, from one of the cooling blocks 212C, 212D, 212E, and 212F to the primary manifold 208, from the cooling block 212A to the cooling block 212N, from the cooling block 212N to the primary manifold 208, and/or from the primary manifold 208 to the cooling system 204, though other fluid circuit arrangements are also contemplated.

FIG. 4B depicts the printed circuit board 402 coupled to the cooling block 212N. As depicted, the circuit board 402 comprises a component 214M that generates heat which may be captured by the cooling block 212N to cool the component 214M. In some examples, multiple components may be mounted to the printed circuit board 402 which may be cooled based at least in part on physical contact or proximity to the cooling block 212N.

In some examples, the thermal management assembly 400 in FIG. 4 may be configured to transfer fluid through a cooling system to cool the fluid, transfer the fluid through a manifold to deliver the fluid to a cooling block associated with a component of a computer system, and transfer the fluid through the cooling block to cool the component of the computer system. The thermal management assembly 200 may also or instead be configured to transfer the fluid from the cooling block to the manifold and/or transfer the fluid from the manifold to the cooling system to cool the fluid.

Figure 5:
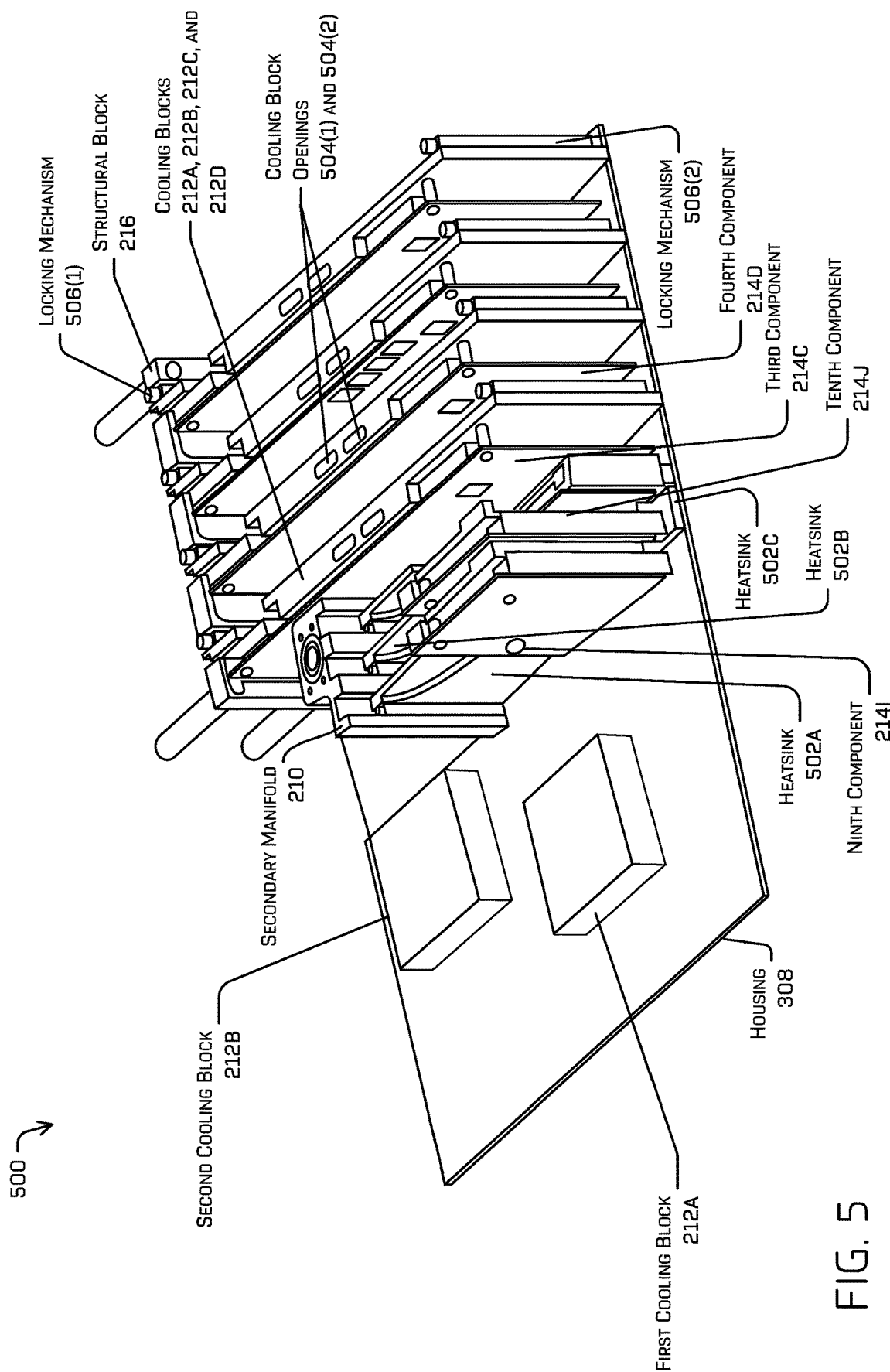
FIG. 5 is another perspective view of the thermal management assembly of FIG. 3 with certain elements omitted for clarity.

FIG. 5 is an illustration of an example thermal management assembly 500 inside an example computer system. As shown, the thermal management assembly 500 comprises cooling blocks 212A, 212B, 212C, 212D, 212E, 212F, components 214C, 214D, 214E, 214F, 214H, 214I, the structural block 216, heatsinks 502A, 502B, and 502C (collectively "heatsinks 502"), cooling blocks openings 504 (1) and 504(2), and locking mechanisms 506(1) and 506(2). The heatsinks 502, in some examples, may comprise heatsink 502A located between the secondary manifold 210 and the component 214I, heatsink 502B located between the secondary manifold 210 and the component 214J, and/or a heatsink 502C located between the component 214J and the housing 308 (e.g., an enclosure) of the computer 506.

A locking mechanism 506 may be used to secure the cooling blocks 212 in a groove of the structural block 216 and/or the secondary manifold 210. In some examples, the locking mechanism 506 may adjust to supply a force between the groove of the structural block 216 and/or the secondary manifold 210 and a portion of one of the cooling blocks 212. Generally, the locking mechanism 506 operates between a secured state that secures the portion of one of the cooling blocks 212 to the structural block 216 and/or the secondary manifold 210, and an unsecured state that enables removal of one or more of the cooling blocks 212 (and the components coupled to the cooling block 212) from one of the computer systems 104. In some examples, the locking mechanism 506 may comprise a laterally expanding wedge lock, a fastener, a clamp, a screw, and so on to secure one of the components 214 and/or one of the cooling blocks 212 to a manifold (e.g., the primary manifold 208 and/or the secondary manifold 210) and/or the structural block 216. In one illustrative example, the locking mechanism 506 may be adjustable to either secure the cooling block 206 to one of the manifolds and/or the structural block 216 or to remove the cooling block 206 from the one of the manifolds and/or the structural block 216.

In some examples, the cooling block openings 504 in each cooling block 212 are configured to exchange fluid with openings in the primary manifold 208. For example, one of the cooling block openings 504 may be configured to receive fluid from the primary manifold 208 while another of the cooling block openings 504 may be configured to transfer the fluid to the primary manifold 208.

Although FIG. 5 shows a specific number of cooling blocks, any number of cooling blocks may be used to cool components of the computer system 206. Further, a number of heatsinks and components may also vary in different configurations.

Figure 6:
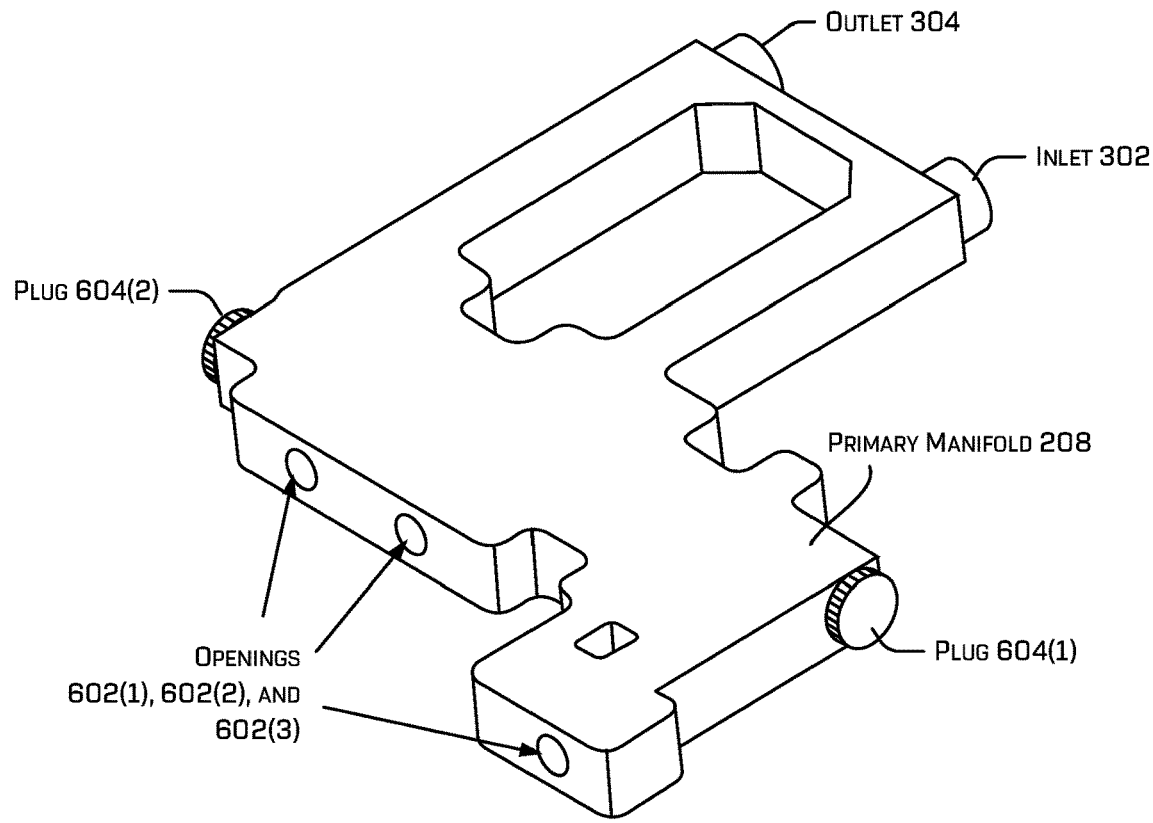
FIG. 6 is an illustration of an example primary manifold of the thermal management assembly of FIG. 3.
Figure 6:
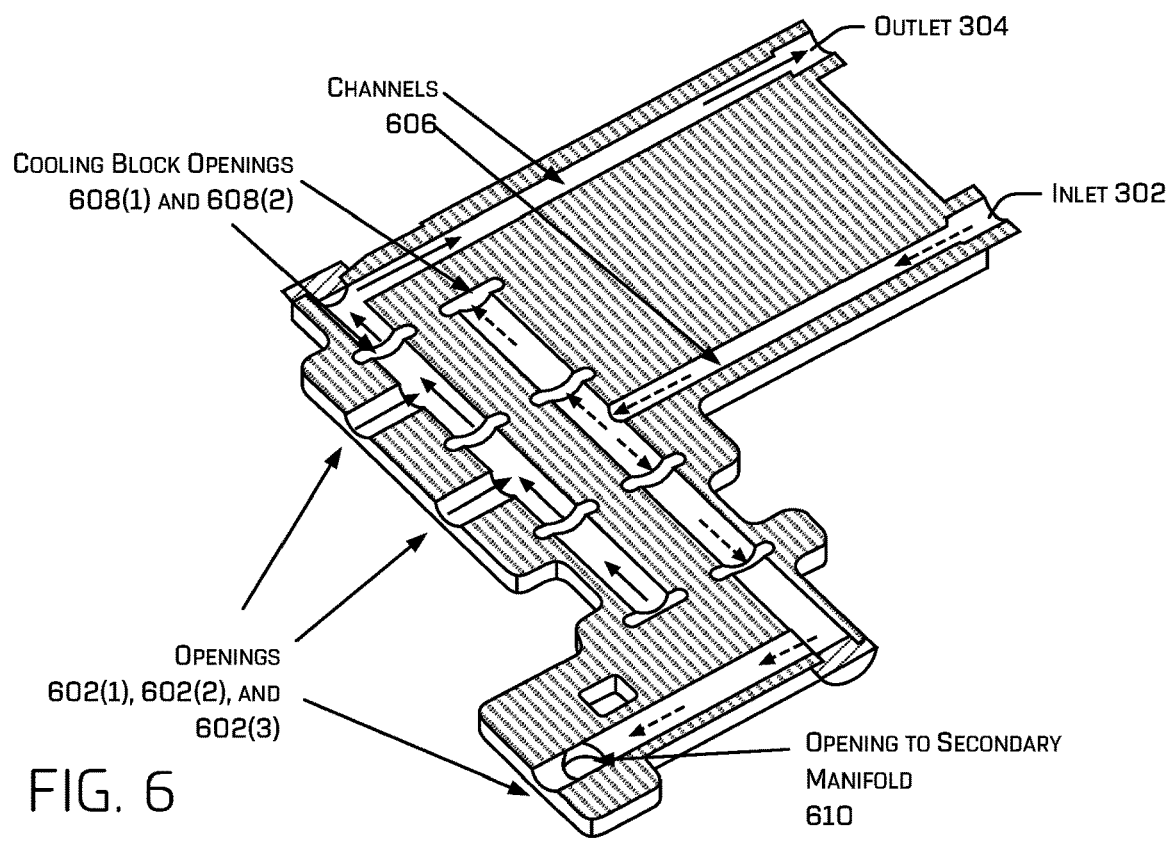

FIG. 6 is an illustration of an example manifold 600 (e.g., the primary manifold 208) in an example thermal management assembly. The primary manifold 208 comprises openings 602(1), 602(2), and 602(3) (collectively "openings 602") to transfer fluid among one or more of: the cooling system 204, the secondary manifold 210, and fluid circuit 306 (e.g., conduits). The primary manifold 208 may also include one or more plugs 604 (e.g., plug 604(1) and plug 604(2) in the example of FIG. 6) that, if removed, provide additional openings for expanding cooling provided by the primary manifold 208 to an additional component(s), cooling block(s), fluid circuit(s), and so on.

In some examples, the primary manifold 208 may comprise the inlet 302 to receive fluid from the cooling system 204 and the outlet 304 to send fluid to the cooling system 204. In various examples, the inlet 302 and/or the outlet 304 connect directly to the primary manifold 208 through a faceplate of one of the computer systems 104. In some examples, the inlet 302 and/or the outlet 304 may represent a quick-connector (e.g., a Voss Quick connector with KoolanceQuick Disconnects) to enable the cooling system 204 to disconnect from the computer system 206.

As shown in FIG. 6, channels 606 enable fluid communication between the primary manifold 208 and one or more of: a cooling block, a fluid circuit, or another manifold. Further, FIG. 6 shows arrows within the channels 606 to indicate a direction of fluid flow.

FIG. 6 also depicts a cut-away view of the inside of the primary manifold 208 including arrows to represent possible paths for fluid to flow within the primary manifold 208. In some examples, the primary manifold 208 comprises cooling block openings 608(1) and 608(2) (collectively cooling block openings 608) that are configured to transfer fluid between the primary manifold 208 and one or more cooling blocks (e.g., cooling blocks 212). For instance, some of the cooling block openings 608 may be used by the primary manifold 208 to send fluid to a cooling block 212 while others of the cooling block openings 608 may be used to receive fluid from the cooling block 212. In examples when the cooling blocks 212 are coupled to the primary manifold 208, heat may be transferred not only by exchanging the fluid between the cooling blocks 212 and the primary manifold 208, but also from heat transferred between exterior surfaces of the primary manifold 208 and the cooling blocks 212. Because fluid flowing through the primary manifold 208 is generally cooler than fluid flowing through the cooling block (e.g., due to heat from a component coupled to the cooling block and the proximity of the primary manifold 208 relative to the cooling system 204 that generates cool fluid), the primary manifold 208 may cool the cooling blocks 212 which in turn enables the cooling blocks 212 to be more effective at cooling the components of one of the computer systems 104.

In some examples, an opening 610 to the secondary manifold is configured to transfer fluid between the primary manifold 208 and to the secondary manifold 210. In some examples, the secondary manifold 210 may return the fluid to the primary manifold 208, while in other examples, the fluid may also or instead flow from the secondary manifold 210 to additional cooling blocks prior to returning to the primary manifold 208.

In some examples, a rate of flow at which the primary manifold 208 transfers fluid between another manifold, a cooling block(s), and/or the cooling system may be determined based at least in part on an area (e.g., a diameter) of the openings 602, an area of the cooling block openings 608, and/or an area of the opening 610 to the secondary manifold 210. For instance, by adjusting (e.g., increasing or decreasing) the area of the openings 602 and/or the area of the cooling block openings 608, a desired rate of flow can be achieved to exchange the fluid within the thermal management assembly to adequately cool the computer system 206.

Figure 7:
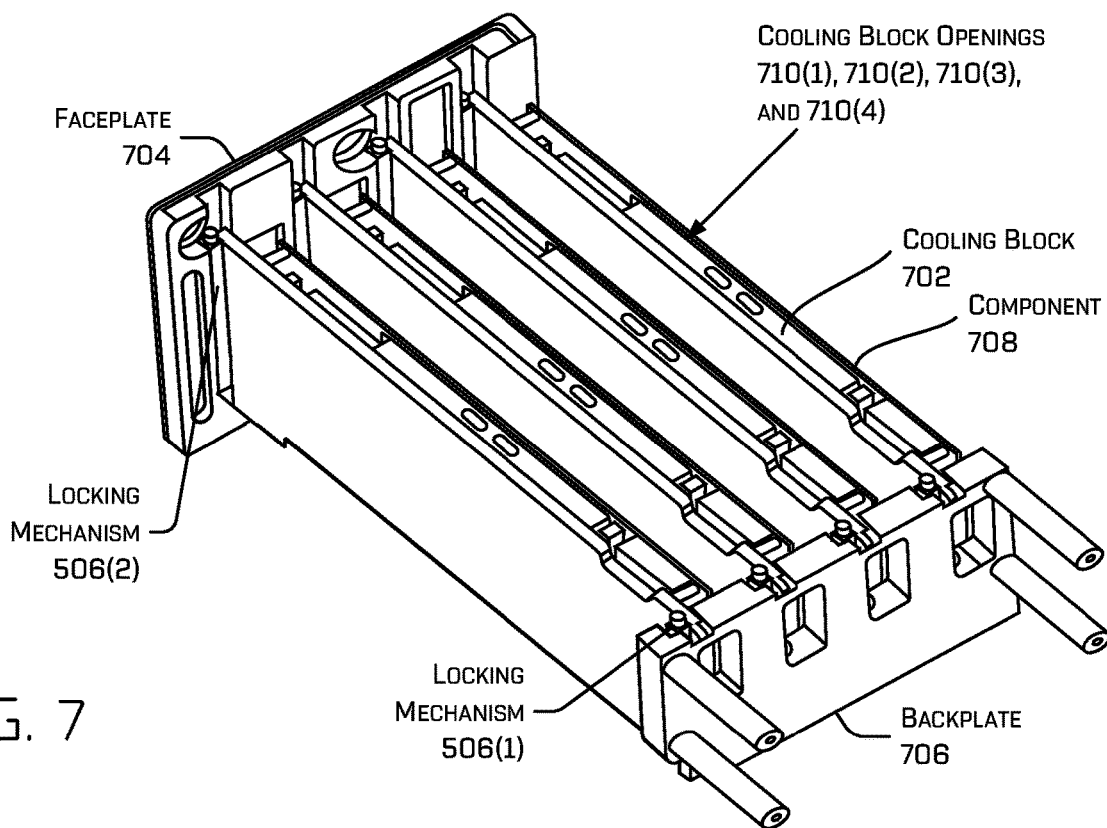
FIG. 7 is an illustration of an example cooling block and an example structural block of the thermal management assembly of FIG. 3.

FIG. 7 is an illustration of an example cooling block 702 coupled to a faceplate 704 and a backplate 706 in a thermal management assembly. In some examples, the cooling block 702 may comprise any of the cooling blocks 212 (e.g., cooling blocks 212C, 212D, 212E, and 212F) to cool the component 708 which is coupled to the cooling block 702. In some examples, the component 708 may comprise any of: (e.g., a central processor unit, a graphics processing unit, a voltage regulator, an ethernet controller, a chipset, a solid-state drive, a power supply, a memory device, or a network interface card, etc.) and may be associated with a printed circuit board that is coupled to the cooling block 702.

The faceplate 704 and/or the backplate 706 may comprise metal (e.g., aluminum, copper, magnesium, etc.) or other conductive material (e.g., graphite, graphene, or other crystal structures, etc.) to transfer heat away from the cooling block 702. In some examples, the faceplate 704 and/or the backplate 706 may be coupled to a heatsink to cool portions of the faceplate 704 and/or the backplate 706. In still further examples, a heatsink may be located between the faceplate 704 and/or the backplate 706 and the component 708 of a computer system to be cooled by the faceplate 704 and/or the backplate 706. Though not shown in FIG. 7, the faceplate 704 and/or the backplate 706 may also be coupled to the primary manifold 208 to be cooled by thermal communication with the primary manifold 208. In some examples, the faceplate 704 and/or the backplate 706 may provide structural and/or thermal functionality of the structural block 216.

FIG. 7 also depicts cooling system openings 710(1), 710(2), 710(3), and 710(4) (collectively "cooling block openings 710") that are configured to mate to the cooling block openings 608 of the primary manifold 208 to transfer fluid between the primary manifold 208 and the cooling block 702. For instance, some of the cooling block openings 710 may be used to send fluid to the primary manifold 208 while others of the cooling block openings 710 may be used to receive fluid from the primary manifold 208. Generally, cooling block openings 710 associated with the cooling block 702 are configured to transfer fluid between the cooling block 702 and a manifold (e.g., the primary manifold 208) such that fluid flowing within the cooling block 702 cools the component 708.

A locking mechanism 506 may be used to secure the cooling block 702 in a groove of the faceplate 704 and/or the backplate 706. In some examples, the locking mechanism 506 may adjust to supply a force between the groove of the faceplate 704 and/or the backplate 706 and a portion of the cooling block 702. Generally, the locking mechanism 506 operates between a secured state that secures a portion of the cooling block 702 to the faceplate 704 and/or the backplate 706, and an unsecured state that enables removal of the cooling block 702 (and the component 708 coupled to the cooling block 702) from the computer system (e.g., the computer system 206). In some examples, the locking mechanism 506, the cooling block 702, the faceplate 704, and/or the backplate 706 are configured to enable the cooling block 702 to be removed from the computer system 206 without affecting fluid flow within the computer system 206 (e.g., without requiring removal of the primary manifold 208). Though depicted as including four openings in FIG. 7, in some examples, any number cooling block openings 710 may be used.

Figure 8:
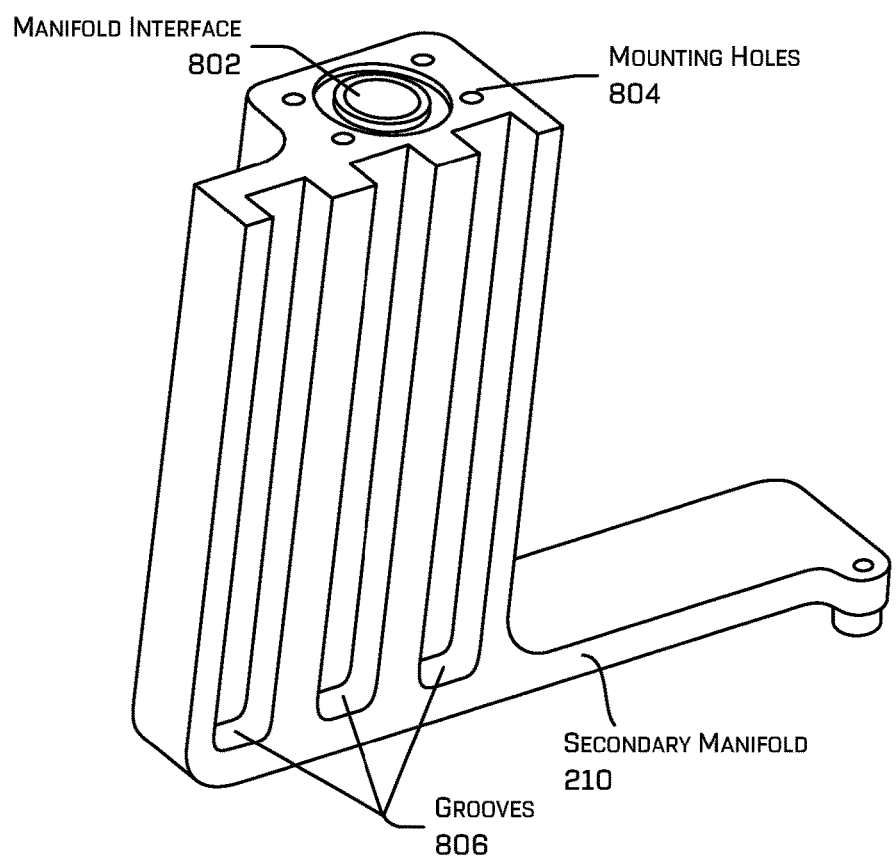
FIG. 8 is an illustration of example secondary manifold of the thermal management assembly of FIG. 3.

FIG. 8 is an illustration of an example secondary manifold 210 in an example thermal management assembly. As illustrated, the secondary manifold 210 comprises a manifold interface 802 to couple directly to the primary manifold 208 via mounting holes 804 that secure the secondary manifold 210 to the primary manifold 208. In some examples, an o-ring or other seal may fit between the primary manifold 208 and secondary manifold 210 to resist fluid leaking from the manifold interface 802. The secondary manifold 210 may also comprise grooves 806 for coupling to a component of the computer system and/or a printed circuit board on which the component is mounted. In some examples, the grooves 806 may accommodate the locking mechanism 506 to attach a component of the computer system 206. In various examples, the locking mechanism 506 may supply a force on one or more surfaces of the grooves 506 of the secondary manifold 210 to secure the component of the computer system 206 (e.g., or a printed circuit board on which the component is mounted) to the secondary manifold 210.

Figure 9:
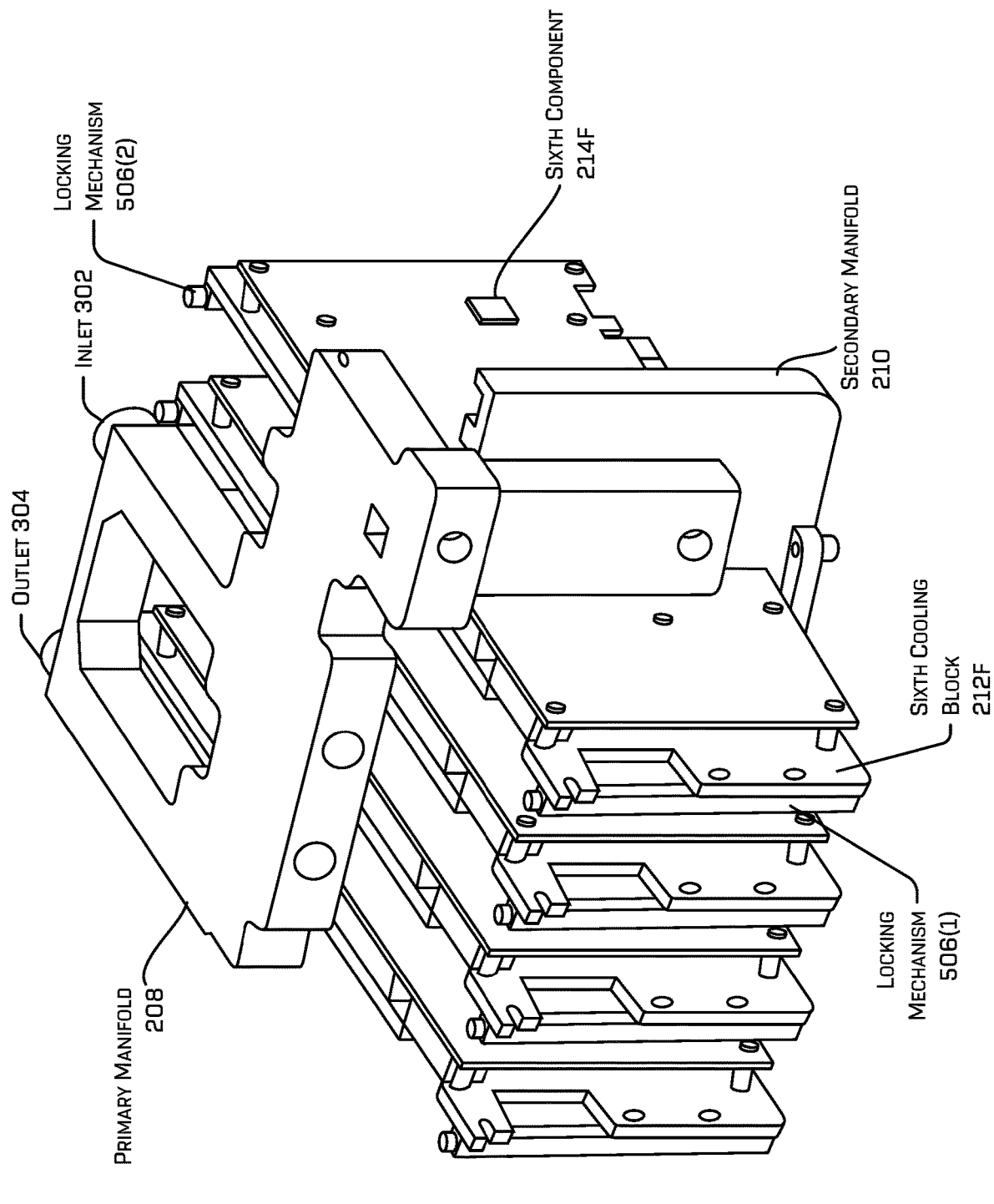
FIG. 9 is an illustration of example connections between the primary manifold, the cooling block, and the secondary manifold in the thermal management assembly of FIG. 3.

FIG. 9 is an illustration of example connections 900 between a primary manifold, a cooling block, and a secondary manifold in a thermal management assembly. For instance, the primary manifold 208 as shown is coupled to the sixth cooling block 212F as well as the secondary manifold 210. In some examples, cooling block openings (e.g., openings 608) in the primary manifold 208 match to cooling block openings (e.g., openings 504) in the sixth cooling block 212F. In some examples, the opening 610 in the primary manifold 208 may mate to the manifold interface 802 in the secondary manifold 210. In some examples, one or more o-rings or other seals may be between the primary manifold 208 and the sixth cooling block 212F, and between the primary manifold 208 and the secondary manifold 210.

FIG. 9 also depicts the cooling block 212F as being coupled to the sixth component 214F of FIG. 2.

Figure 10A:
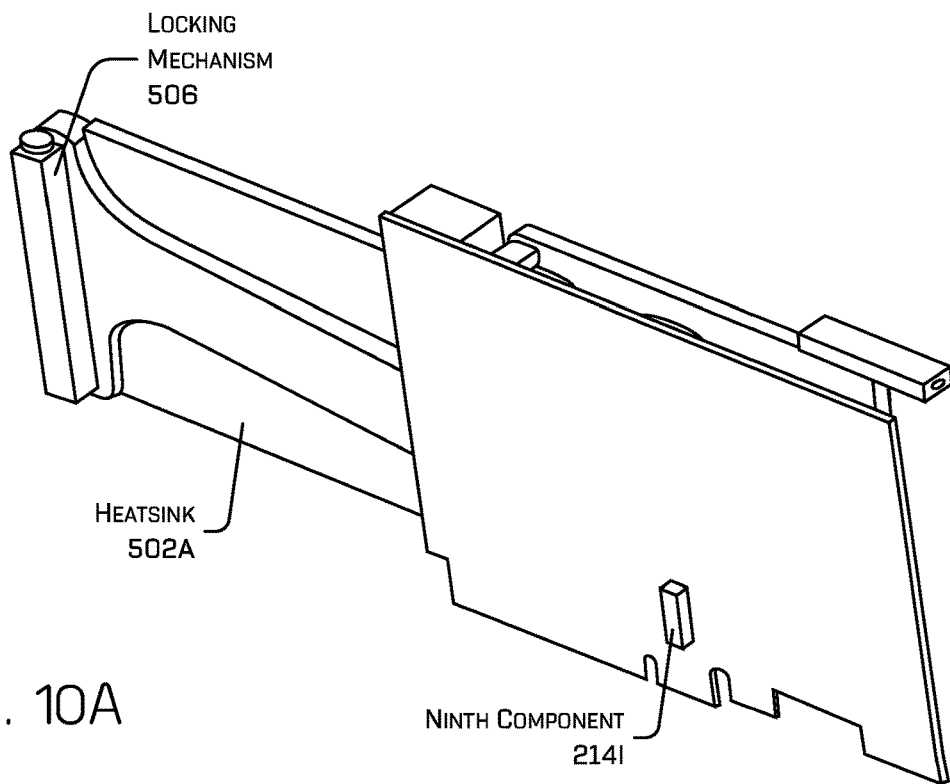
FIGS. 10A and 10B are illustrations of an example heatsink of the thermal management assembly of FIG. 5 coupled to an example component of a computer system.
Figure 10B:
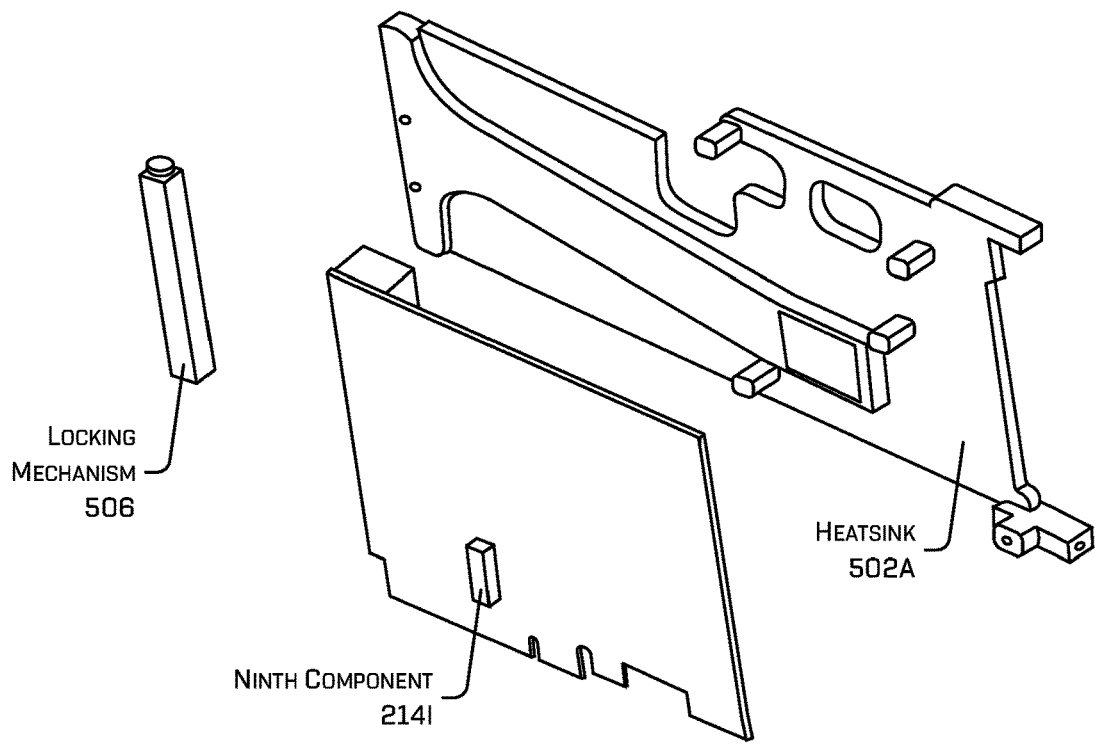

FIGS. 10A and 10B are illustrations of an example heatsink 502A of the thermal management assembly of FIG. 5 coupled to the ninth component 214I of the example computer system 206. For instance, the heatsink 502A may be coupled to the component 214I at a first end of the heatsink 502A and may be coupled to the secondary manifold 210 at a second end of the heatsink 502A. In some examples, the locking mechanism 506 may be used to secure the heatsink 502A to the secondary manifold 210. Heat generated by the ninth component 214I may transfer through the heatsink 502A to the secondary manifold 210 to cool the ninth component 214I. In some examples, the ninth component 214I may be any one of: a central processor unit, a graphics processing unit, a voltage regulator, an ethernet controller, a chipset, a solid-state drive, a power supply, or a network interface card. In some examples, the ninth component 214I may be cooled not only by the secondary manifold 210 and the heatsink 502A but also by an additional heatsink attached between a portion of the ninth component 214I and a portion of a housing of the computer system. In various examples, the heatsink 502A may comprise metal such as aluminum, magnesium, copper, or other metal with conductive properties.

In some examples, the locking mechanism 506 and/or the heatsink 502A may be configured to be removed from the secondary manifold 210 without disassembling the primary manifold 208. Thus, the ninth component 214I coupled to the heatsink 502A can be removed from the computer system (e.g., detached from the secondary manifold 210) without interrupting cooling provided by the primary manifold 208.

FIGS. 11A and 11B are illustrations of an example thermal management assembly 1100 to cool a computer system 1102. The computer system may, in some examples, correspond to one or more of the computer systems 104 of FIG. 1, the computer system 206 of FIG. 2, or the vehicle computer system 1404 of FIG. 14. FIGS. 11A and 11B also show a first thermal coupling 1104, a second thermal coupling 1106, a first cooling block 1108, a second cooling block 1110, a first cooling system 1112, and a second cooling system 1114. In some examples, the cooling architecture of FIGS. 2-10 may be used for one or both of the redundant cooling systems (e.g., the first cooling system 1112 and/or the second cooling system 1114) of FIG. 11.

In some examples, the first cooling system 1112 and the second cooling system 1114 may be isolated from one another while in other examples the first cooling system 1112 and the second cooling system 1114 may be in fluid communication with each other.

In some examples, the first thermal coupling 1104 may comprise a first heat pipe or a first fluid circuit while the second thermal coupling 1106 may comprise a second heat pipe or a second fluid circuit. In some examples, the first heat pipe may be different than the second heat pipe while in other examples a single heat pipe may extend from the first cooling block 1108 to the second cooling block 1110. In addition, or in the alternative, the first fluid circuit may be different than the second fluid circuit while in other examples the first fluid circuit may be in fluid communication (e.g., exchange fluid) with the second fluid circuit.

In some examples, the first thermal coupling 1104 may cause heat to move from a first portion of the first thermal coupling 1104 near a first component 1116 to a second portion of the first thermal coupling 1104 adjacent to the first cooling block 1108. In some examples, the second thermal coupling 1106 may cause heat to move from a first portion of the second thermal coupling 1106 near a first component 1116 to a second portion of the second thermal coupling 1106 adjacent to the second cooling block 1110.

Generally, heat moves to the coolest of the first cooling block 1108 and the second cooling block 1110. In examples that when the first thermal coupling 1104 is a heat pipe, heat moves inside the heat pipe as vapor to the cooler of the first cooling block 1108 and the second cooling block 1110. In some examples, thermal energy is also exchanged between an exterior surface of the heat pipe and air thereby further cooling an ambient temperature inside a housing of the computer system 1102.

In some examples, the first thermal coupling 1104 and the second thermal coupling 1106 may be coupled directly to one another to represent one continuous thermal coupling between the first cooling block 1108 and the second cooling block 1110 (with the thermal coupling continuing behind the first component 1116 and the second component 1118 in FIG. 11A).

As shown in FIG. 11B, in some examples, the first thermal coupling 1104 and the second thermal coupling 1106 may be coupled to each other by a third thermal coupling 1120. In various examples, the third thermal coupling 1120 thermally connects the first thermal coupling 1104 and the second thermal coupling 1106 (and the cooling blocks in thermal communication with each thermal coupling).

In some examples, the first cooling system 1112 may be unavailable (e.g., due to failure and/or due to being located in a driving assembly that is detached from a body of a vehicle) as shown at 1122 in FIG. 11B. In such examples, the third thermal coupling 1120 and the second thermal coupling 116 transfer heat from the first component 1116 and the second component 1118 to the second cooling block 1110. In this way, redundant cooling techniques are provided to the computer system 1102 to ensure adequate cooling is available to the computer system 1102 even during failure of one of the cooling systems (e.g., during failure of an HVAC system in a vehicle).

Figure 12A:
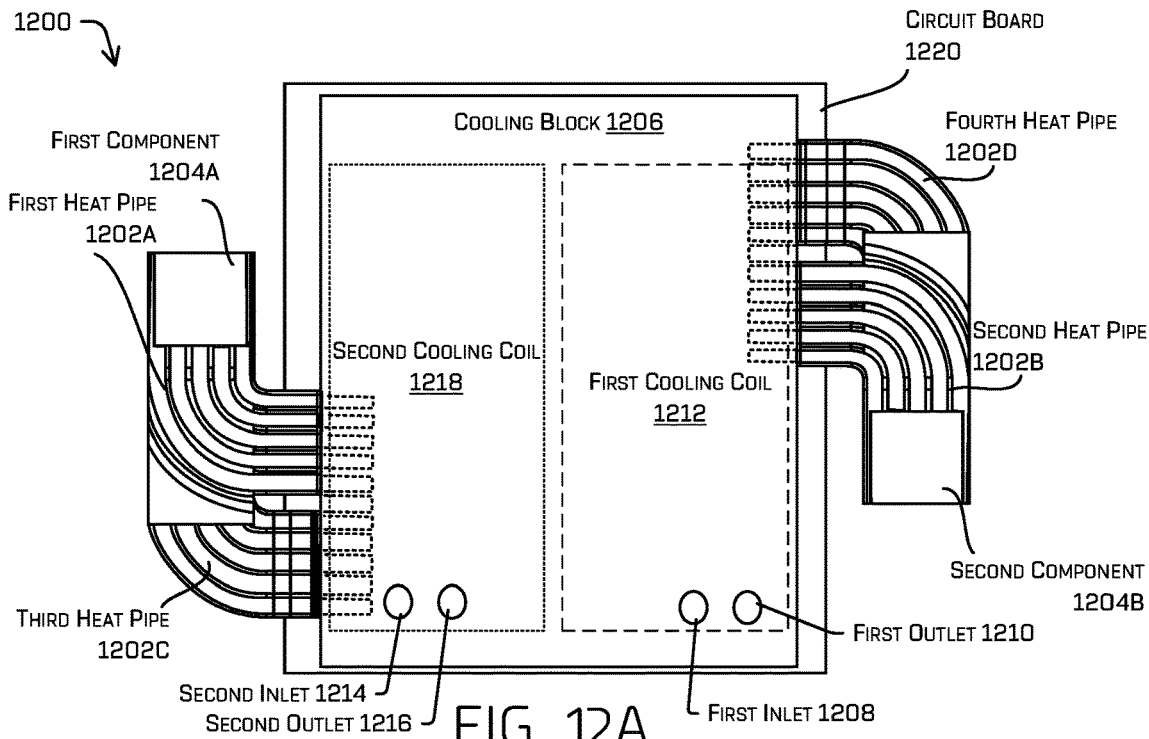
FIGS. 12A, 12B, and 12C are illustrations of an example thermal management assembly to cool a computer system.
Figure 12B:
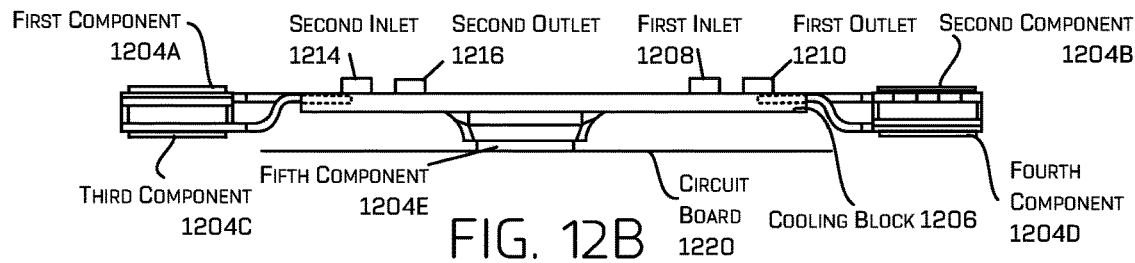
Figure 12C:
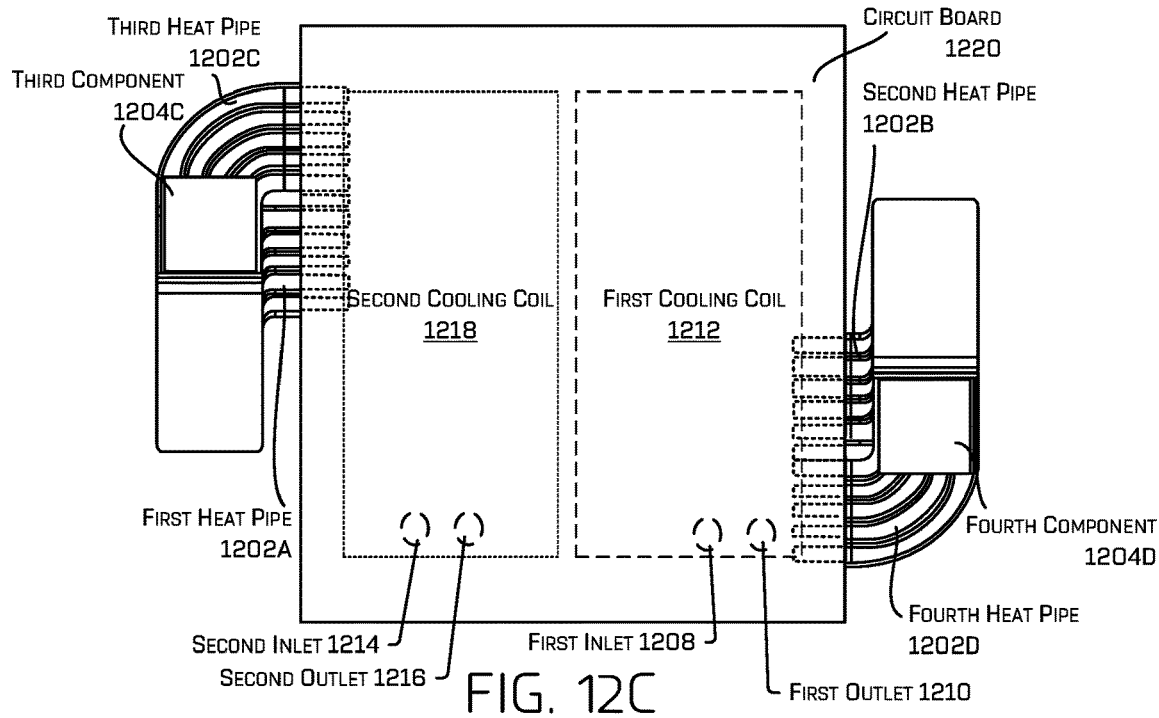

FIGS. 12A, 12B, and 12C are illustrations of an example thermal management assembly 1200 inside an example computer system. FIG. 12A is a top perspective view that includes heat pipes 1202A, 1202B, 1202C, and 1202D (collectively "heat pipes 1202"), components 1204A, 1204B, 1204C, 1204D, and 1204E (collectively "components 1204"), cooling block 1206 that includes a first inlet 1208, a first outlet 1210, a first cooling coil 1212, a second inlet 1214, a second outlet 1216, a second cooling coil 1218, and a circuit board 1220. In some examples, the cooling architecture of FIG. 12 may be used with one or both of the redundant cooling systems (e.g., the first cooling system 1112 and/or the second cooling system 1114) of FIG. 11. For instance, the first cooling system 1112 may be in fluid communication with the first cooling coil 1212 via the first inlet 108 and the first outlet 1210 and the second cooling system 1114 may be in fluid communication with the second cooling coil 1218 via the second inlet 1214 and the second outlet 1216. In this way, the cooling block 1206 may be cooled by one or both of the first cooling system 1112 and/or the second cooling system 1114.

In some examples, the heat pipes 1202 may comprise one or more metal pipes (e.g., one or more copper or aluminum pipes) that transport hot vapor from the components 1204 towards the cooling block 1206. The cooling block 1206 may, in some examples, receive fluid from a cooling system (e.g., the cooling system 204 of FIG. 2) at the first inlet 1208 and send fluid to the cooling system by way of the first outlet 1210. In some examples, each of the heat pipes 1202A, 1202B, 1202C, and 1202D shown in FIGS. 12A, 12B, and 12C may comprise multiple metal pipes. In other examples, each of the heat pipes 1202A, 1202B, 1202C, and 1202D may comprise a single metal pipe.

In addition or in the alternative, in some examples, the thermal management assembly 1200 may comprise a solid metal conductor, such as copper, to transfer thermal energy between one of the components 1204 and the cooling block 1206. For instance, the cooling block 1206 may cool the components 1204 using the solid metal conductor in addition to, or instead of the heat pipes 1202.

The components 1204 may comprise one of: a central processor unit, a graphics processing unit, a voltage regulator, an ethernet controller, a chipset, a solid-state drive, a power supply, a memory device, an image processing unit, or a network interface card. By way of example and not limitation, components 1204A, 1204B, 1204C, and 1204D may be graphics processing units while the component 1204E may comprise a central processing unit. Regardless of which types of components are cooled, the thermal management assembly 1200 enables the cooling block 1206 to cool, in this illustrative example, five different components.

In some examples, the first inlets 1208 and 1214 and/or the first outlets 1210 and 1216 may represent a quick-connector, or other connector, to enable the first cooling system 1112 and/or the second cooling system 1114 to connect to and disconnect from the cooling block 1206.

The first cooling coil 1212 and the second cooling coil 1218 represent one or more thermal elements than enable a first fluid of the first cooling system 1112 and/or a second fluid of the second cooling system 1114 to cool the cooling block 1206. In some examples, each of the first cooling coil 1212 and the second cooling coil 1218 comprise separate fluid circuits that contact portions of the heat pipes 1202 that extend into, on, adjacent, and/or around a portion of the cooling block 1206 (as shown in FIGS. 12A, 12B, and 12C by the heat pipes 1202 in dashed lines). In various examples, each of the first cooling coil 1212 and the second cooling coil 1218 may comprise an area substantially equal to an area of the cooling block 206. In other words, the dashed lines representing the first cooling coil 1212 and the second cooling coil 1218 in FIG. 12A may comprise a variety of sizes and configurations up to an area substantially equal to an area of the cooling block 1206. By including the first cooling coil 1212, the second cooling coil 1218, the first inlets 1208 and 1214, and the first outlets 1210 and 1216, the cooling block 1206 may be cooled by redundant cooling systems. In this way, the cooling block 1206 may cool the components 1204 regardless of a failure of one of the first cooling system 1112 or the second cooling system 1114.

The circuit board 1220 may be representative of a printed circuit board on which the fifth component 1204E may be mounted.

FIG. 12B is a side perspective view of the thermal management assembly 1200 that shows the heat pipes 1202 arranged to cool the corresponding components 1204 by transferring heat (e.g., vapor) to the cooling block 1206.

FIG. 12C is a bottom perspective view of the thermal management assembly 1200 that shows the heat pipes 1202 arranged between the components 1204 and the cooling block 1206.

Figure 13:
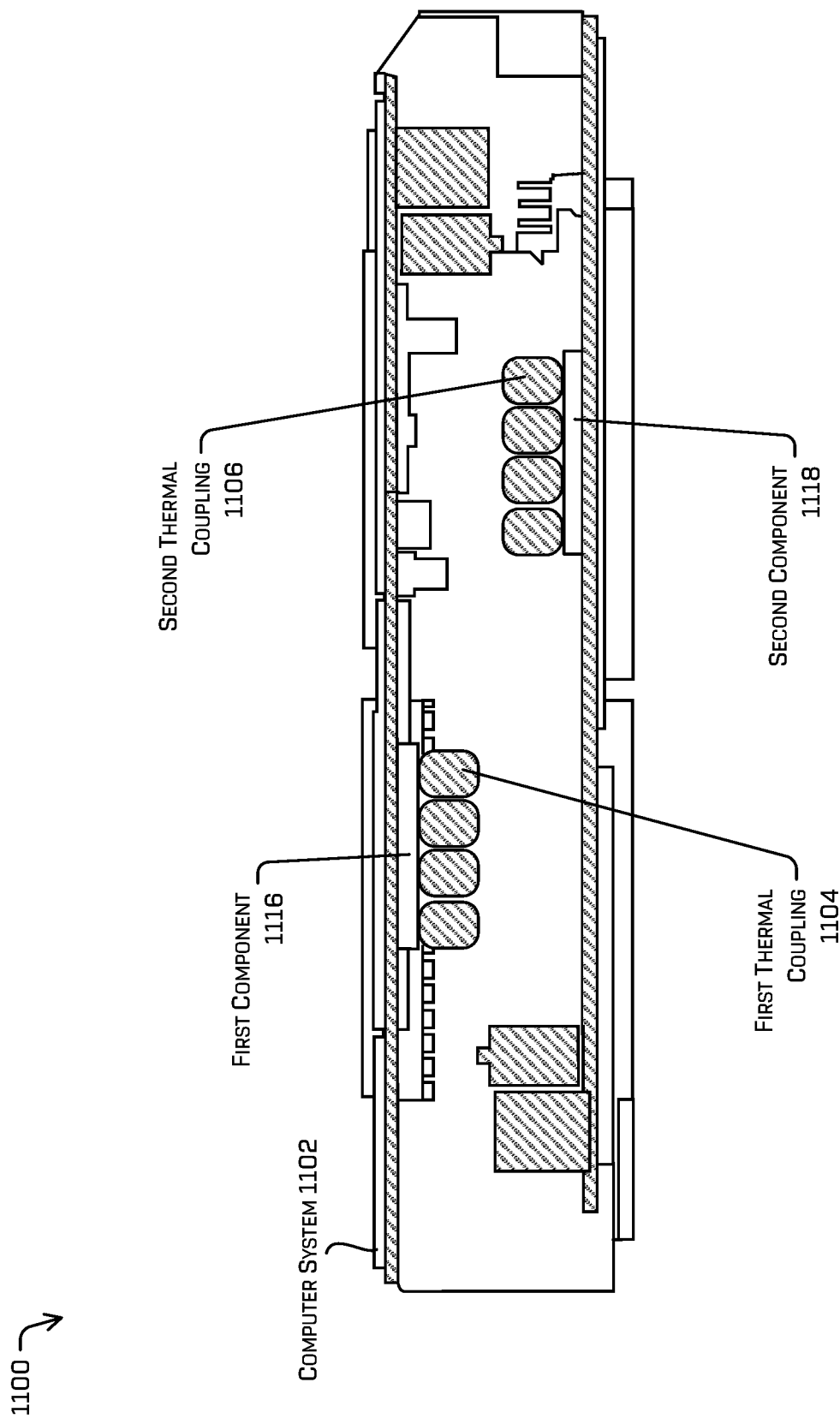
FIG. 13 is a cross-section illustration of the thermal management assembly of FIG. 11.

FIG. 13 is a cross-section illustration of the thermal management assembly 1100 of FIG. 11 to cool the computer system 1102. The first thermal coupling 1104 may be configured to transfer thermal energy between the first cooling system 1112 and the computer system 1102, and the second thermal coupling 1106 may be configured to transfer thermal energy between the second cooling system 1114 and the computer system 1102.

As depicted in FIG. 13, the first thermal coupling 1104 and/or the second thermal coupling 1106 may include any number of heat pipe(s) and/or fluid circuits. For instance, each of the first thermal coupling 1104 and the second thermal coupling 1106 are associated with four thermal couplings though more or less thermal couplings are possible in some examples. In various examples, the first thermal coupling 1104 may comprise a first set of heat pipes or a first set of fluid circuits to cool the first component 1304 while the second thermal coupling 1106 may comprise a second set of heat pipes or a second set of fluid circuits to cool the second component 1118. In some examples, either of the first component 1116 or the second component 1118 may comprise one of: a central processor unit, a graphics processing unit, a voltage regulator, an ethernet controller, a chipset, a solid-state drive, a power supply, a memory device, an image processing unit, or a network interface card. By including two the first cooling system and the second cooling system, at least one cooling system may be available to cool the computer system 1102 when another of the cooling systems fails, or is being serviced (e.g., when a drive assembly in which the cooling system is located is detached from a body of a vehicle).

In some examples, the first thermal coupling 1104 (e.g. a first heat pipe) may be different than the second thermal coupling 1106 (e.g., a second heat pipe) while in other examples the first thermal coupling 1104 and the second thermal coupling 1106 may comprise a single thermal coupling (e.g., a single heat pipe).

In various examples, a first fluid from the first cooling system 1112 and/or a second fluid from the second cooling system 1114 is supplied to the thermal management assembly 1100 via the first thermal coupling 110 of FIG. 1 and/or the second thermal coupling 112 of FIG. 1. The first thermal coupling 110 and the second thermal coupling 112 may, in some examples, be configured to transfer heat captured by the first thermal coupling 1104 and/or the second thermal coupling 1106 to the first cooling system 1112 or the second cooling system 1114.

Figure 14:
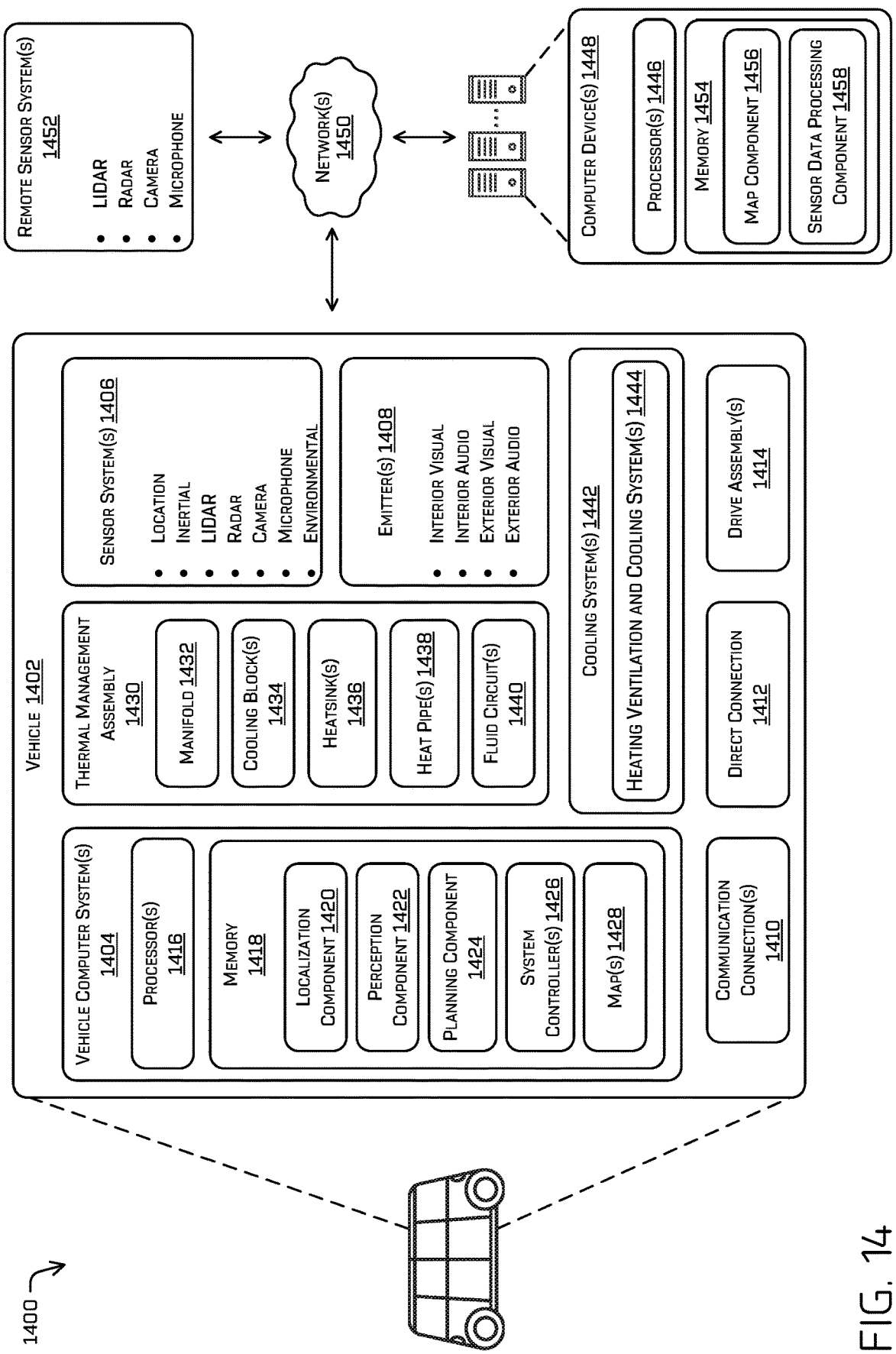
FIG. 14 is a block diagram of an example system for implementing the techniques described herein.

FIG. 14 is a block diagram of an example system 1400 for implementing the techniques described herein. In at least one example, the system 1400 may include a vehicle, such as vehicle 1402. The vehicle 1402 may include a vehicle computer system 1404, one or more sensor systems 1406, one or more emitters 1408, one or more communication connections 1410, at least one direct connection 1412, and one or more drive assemblies 1414.

The vehicle computer system 1404 may include one or more processors 1416 and memory 1418 communicatively coupled with the one or more processors 1416. In the illustrated example, the vehicle 1402 is an autonomous vehicle; however, the vehicle 1402 could be any other type of vehicle, such as a semi-autonomous vehicle, or any other system having at least an image capture device (e.g., a camera enabled smartphone). In the illustrated example, the memory 1418 of the vehicle computer system 1404 stores a localization component 1420, a perception component 1422, a planning component 1424, one or more system controllers 1426, and one or more maps 1428. Though depicted in FIG. 14 as residing in the memory 1418 for illustrative purposes, it is contemplated that the localization component 1420, a perception component 1422, a planning component 1424, one or more system controllers 1426, and/or one or more maps 1428 additionally, or alternatively, be accessible to the vehicle 1402 (e.g., stored on, or otherwise accessible by, memory remote from the vehicle 1402, such as, for example, on memory 1454 of a remote computer device 1448). In some examples, multiple vehicle computer systems may be included on the vehicle 1402 and may be cooled using the thermal techniques described herein.

In at least one example, the localization component 1420 may include functionality to receive data from the sensor system(s) 1406 to determine a position and/or orientation of the vehicle 1402 (e.g., one or more of an x-, y-, z-position, roll, pitch, or yaw). For example, the localization component 1420 may include and/or request/receive a map of an environment, such as from map(s) 1428 and/or map component 1456 and may continuously determine a location and/or orientation of the autonomous vehicle within the map. In some instances, the localization component 1420 may utilize SLAM (simultaneous localization and mapping), CLAMS (calibration, localization and mapping, simultaneously), relative SLAM, bundle adjustment, non-linear least squares optimization, or the like to receive image data, lidar data, radar data, IMU data, GPS data, wheel encoder data, and the like to accurately determine a location of the autonomous vehicle. In some instances, the localization component 1420 may provide data to various components of the vehicle 1402 to determine an initial position of an autonomous vehicle for determining the relevance of an object to the vehicle 1402, as discussed herein.

In some instances, the perception component 1422 may include functionality to perform object detection, segmentation, and/or classification. In some examples, the perception component 1422 may provide processed sensor data that indicates a presence of an object (e.g., entity) that is proximate to the vehicle 1402 and/or a classification of the object as an object type (e.g., car, pedestrian, cyclist, animal, building, tree, road surface, curb, sidewalk, unknown, etc.). In some examples, the perception component 1422 may provide processed sensor data that indicates a presence of a stationary entity that is proximate to the vehicle 1402 and/or a classification of the stationary entity as a type (e.g., building, tree, road surface, curb, sidewalk, unknown, etc.). In additional or alternative examples, the perception component 1422 may provide processed sensor data that indicates one or more features associated with a detected object (e.g., a tracked object) and/or the environment in which the object is positioned. In some examples, features associated with an object may include, but are not limited to, an x-position (global and/or local position), a y-position (global and/or local position), a z-position (global and/or local position), an orientation (e.g., a roll, pitch, yaw), an object type (e.g., a classification), a velocity of the object, an acceleration of the object, an extent of the object (size), etc. Features associated with the environment may include, but are not limited to, a presence of another object in the environment, a state of another object in the environment, a time of day, a day of a week, a season, a weather condition, an indication of darkness/light, etc.

In general, the planning component 1424 may determine a path for the vehicle 1402 to follow to traverse through an environment. For example, the planning component 1424 may determine various routes and trajectories and various levels of detail. For example, the planning component 1424 may determine a route to travel from a first location (e.g., a current location) to a second location (e.g., a target location). For the purpose of this discussion, a route may include a sequence of waypoints for travelling between two locations. As non-limiting examples, waypoints include streets, intersections, global positioning system (GPS) coordinates, etc.

Further, the planning component 1424 may generate an instruction for guiding the autonomous vehicle along at least a portion of the route from the first location to the second location. In at least one example, the planning component 1424 may determine how to guide the autonomous vehicle from a first waypoint in the sequence of waypoints to a second waypoint in the sequence of waypoints. In some examples, the instruction may be a trajectory, or a portion of a trajectory. In some examples, multiple trajectories may be substantially simultaneously generated (e.g., within technical tolerances) in accordance with a receding horizon technique, wherein one of the multiple trajectories is selected for the vehicle 1402 to navigate.

In some examples, the planning component 1424 may include a prediction component to generate predicted trajectories of objects (e.g., objects) in an environment. For example, a prediction component may generate one or more predicted trajectories for objects within a threshold distance from the vehicle 1402. In some examples, a prediction component may measure a trace of an object and generate a trajectory for the object based on observed and predicted behavior.

In at least one example, the vehicle computer system 1404 may include one or more system controllers 1426, which may be configured to control steering, propulsion, braking, safety, emitters, communication, and other systems of the vehicle 1402. The system controller(s) 1426 may communicate with and/or control corresponding systems of the drive assembly(s) 1414 and/or other components of the vehicle 1402.

The memory 1418 may further include one or more maps 1428 that may be used by the vehicle 1402 to navigate within the environment. For the purpose of this discussion, a map may be any number of data structures modeled in two dimensions, three dimensions, or N-dimensions that are capable of providing information about an environment, such as, but not limited to, topologies (such as intersections), streets, mountain ranges, roads, terrain, and the environment in general. In some instances, a map may include, but is not limited to: texture information (e.g., color information (e.g., RGB color information, Lab color information, HSV/HSL color information), and the like), intensity information (e.g., lidar information, radar information, and the like); spatial information (e.g., image data projected onto a mesh, individual "surfels" (e.g., polygons associated with individual color and/or intensity)), reflectivity information (e.g., specularity information, retroreflectivity information, BRDF information, BSSRDF information, and the like). In one example, a map may include a three-dimensional mesh of the environment. In some examples, the vehicle 1402 may be controlled based at least in part on the map(s) 1428. That is, the map(s) 1428 may be used in connection with the localization component 1420, the perception component 1422, and/or the planning component 1424 to determine a location of the vehicle 1402, detect objects in an environment, generate routes, determine actions and/or trajectories to navigate within an environment.

In some examples, the one or more maps 1428 may be stored on a remote computing device(s) (such as the computer device(s) 1448) accessible via network(s) 1450. In some examples, multiple maps 1428 may be stored based on, for example, a characteristic (e.g., type of entity, time of day, day of week, season of the year, etc.). Storing multiple maps 1428 may have similar memory requirements but increase the speed at which data in a map may be accessed.

FIG. 14 also illustrates the vehicle 1402 including a thermal management assembly 1430 that includes a manifold 1432, cooling block(s) 1434, heatsink(s) 1436, heat pipe(s) 1438, and fluid circuit(s) 1440. The vehicle 1402 is also shown to include cooling system(s) 1442 that includes heating ventilation and cooling system(s) 1444. In some examples, the heating ventilation and cooling system(s) 1444 may comprise an evaporator(s), a condenser(s), a compressor(s), and/or a chiller(s). In some examples, the cooling system 1442 is coupled to and/or in fluid communication with the thermal management assembly 1430 to cool the vehicle computer system 1404. In various examples, the thermal management assembly 1430 may be in thermal communication and/or fluid communication with two cooling systems 1442 (e.g., with each cooling system 1442 located in different drive assemblies 1414.

In various examples, the thermal management assembly 1430 may supply fluid between the cooling system 1442 and the manifold 1432. The manifold 1432 may correspond to the primary manifold 208, the secondary manifold 210, or a combination of the primary manifold 208 and the secondary manifold 210. For instance, the manifold 1432 may be configured to transfer fluid to direct fluid (e.g., a liquid, a gas, or a combination of liquid and gas) to one or more cooling blocks 1434 to cool different components of the vehicle computer system 1404. In some examples, the manifold 1432 may direct fluid from the cooling system 1442 to multiple cooling blocks 1434 in parallel to supply fluid at a first temperature to each of the multiple cooling blocks 1434 at substantially the same time and without first passing through another of the multiple cooling blocks 1434. The manifold 1432 may also or instead be configured to direct fluid from the multiple cooling blocks 1434 to the cooling system 1442 to cool the fluid.

In some examples, the cooling block(s) 1434 may be associated with different components of the vehicle computer system 1404 such as the one or more processor(s) 1416, the localization component 1420, the perception component 1422, the planning component 1424, the one or more system controllers 1426, and the one or more maps 1428. Additionally, or in the alternative, the cooling block(s) 1434 may be associated with a graphics processing unit, a central processing unit, a voltage regulator, an ethernet controller, a chipset, a solid-state drive, a power supply, a memory device, an image processing unit, and/or a network interface card of the vehicle computer system 1404.

In some examples, the heatsink 1436 may be between the manifold 1432 and a component of the vehicle computer system 1404 to provide thermal cooling to the component of the vehicle computer system 1404. Here, the heatsink 1436 in contact with a portion of the component draws heat from the component to the manifold 1432. The heatsink 1436 can be configured in a variety of shapes and sizes to extend from the manifold 1432 to a component of the computer system that generates heat. In some examples, the heatsink 1436 may comprise metals such as aluminum, magnesium, copper, etc. and/or crystal structures such as graphite, graphene, and so on. In some examples, the heatsink 1436 may be configured to extend from a portion of the cooling block 1434 and/or the manifold 1432 to a component of the vehicle computer system 1404. Thus, in examples, the heatsink 1432 may cool a first portion of the computer component while the manifold 1432 may cool a second portion of the computer component.

In some examples, the heat pipe(s) 1438 may be representative of heat pipes 1202 in FIG. 12.

In some examples, the fluid circuit(s) 1440 may be used to transfer fluid among the cooling system 1442, the manifold 1432, and/or the cooling blocks 1434. In some examples a first fluid circuit may be associated with a first cooling system and a second fluid circuit may be associated with a second cooling system.

As can be understood, the components discussed herein (e.g., the localization component 1420, the perception component 1422, the planning component 1424, the one or more system controllers 1426, the one or more maps 1428, are described as divided for illustrative purposes. However, the operations performed by the various components may be combined or performed in any other component of the vehicle computer system 1404.

In some instances, aspects of some or all of the components discussed herein may include any models, techniques, and/or machine learned techniques. For example, in some instances, the components in the memory 1418 (and the memory 1454, discussed below) may be implemented as a neural network.

As described herein, an exemplary neural network is a biologically inspired technique which passes input data through a series of connected layers to produce an output. Each layer in a neural network may also comprise another neural network, or may comprise any number of layers (whether convolutional or not). As can be understood in the context of this disclosure, a neural network may utilize machine learning, which may refer to a broad class of such techniques in which an output is generated based on learned parameters.

Although discussed in the context of neural networks, any type of machine learning may be used consistent with this disclosure. For example, machine learning techniques may include, but are not limited to, regression techniques (e.g., ordinary least squares regression (OLSR), linear regression, logistic regression, stepwise regression, multivariate adaptive regression splines (MARS), locally estimated scatterplot smoothing (LOESS)), instance-based techniques (e.g., ridge regression, least absolute shrinkage and selection operator (LASSO), elastic net, least-angle regression (LARS)), decisions tree techniques (e.g., classification and regression tree (CART), iterative dichotomiser 3 (ID3), Chi-squared automatic interaction detection (CHAID), decision stump, conditional decision trees), Bayesian techniques (e.g., naïve Bayes, Gaussian naïve Bayes, multinomial naïve Bayes, average one-dependence estimators (AODE), Bayesian belief network (BNN), Bayesian networks), clustering techniques (e.g., k-means, k-medians, expectation maximization (EM), hierarchical clustering), association rule learning techniques (e.g., perceptron, back-propagation, hopfield network, Radial Basis Function Network (RBFN)), deep learning techniques (e.g., Deep Boltzmann Machine (DBM), Deep Belief Networks (DBN), Convolutional Neural Network (CNN), Stacked Auto-Encoders), Dimensionality Reduction Techniques (e.g., Principal Component Analysis (PCA), Principal Component Regression (PCR), Partial Least Squares Regression (PLSR), Sammon Mapping, Multidimensional Scaling (MDS), Projection Pursuit, Linear Discriminant Analysis (LDA), Mixture Discriminant Analysis (MDA), Quadratic Discriminant Analysis (QDA), Flexible Discriminant Analysis (FDA)), Ensemble Techniques (e.g., Boosting, Bootstrapped Aggregation (Bagging), AdaBoost, Stacked Generalization (blending), Gradient Boosting Machines (GBM), Gradient Boosted Regression Trees (GBRT), Random Forest), SVM (support vector machine), supervised learning, unsupervised learning, semi-supervised learning, etc. Additional examples of architectures include neural networks such as ResNet70, ResNet101, VGG, DenseNet, PointNet, and the like.

In at least one example, the sensor system(s) 1406 may include lidar sensors, radar sensors, ultrasonic transducers, sonar sensors, location sensors (e.g., GPS, compass, etc.), inertial sensors (e.g., inertial measurement units (IMUs), accelerometers, magnetometers, gyroscopes, etc.), cameras (e.g., RGB, IR, intensity, depth, time of flight, etc.), microphones, wheel encoders, environment sensors (e.g., temperature sensors, humidity sensors, light sensors, pressure sensors, etc.), etc. The sensor system(s) 1406 may include multiple instances of each of these or other types of sensors. For instance, the lidar sensors may include individual lidar sensors located at the corners, front, back, sides, and/or top of the vehicle 1402. As another example, the camera sensors may include multiple cameras disposed at various locations about the exterior and/or interior of the vehicle 1402. The sensor system(s) 1406 may provide input to the vehicle computer system 1404. Additionally, or in the alternative, the sensor system(s) 1406 may send sensor data, via the one or more networks 1450, to the one or more computing device(s) 1448 at a particular frequency, after a lapse of a predetermined period of time, in near real-time, etc.

The vehicle 1402 may also include one or more emitters 1408 for emitting light and/or sound. The emitters 1408 may include interior audio and visual emitters to communicate with passengers of the vehicle 1402. By way of example and not limitation, interior emitters may include speakers, lights, signs, display screens, touch screens, haptic emitters (e.g., vibration and/or force feedback), mechanical actuators (e.g., seatbelt tensioners, seat positioners, headrest positioners, etc.), and the like. The emitter(s) 1408 may also include exterior emitters. By way of example and not limitation, the exterior emitters may include lights to signal a direction of travel or other indicator of vehicle action (e.g., indicator lights, signs, light arrays, etc.), and one or more audio emitters (e.g., speakers, speaker arrays, horns, etc.) to audibly communicate with pedestrians or other nearby vehicles, one or more of which comprising acoustic beam steering technology.

The vehicle 1402 may also include one or more communication connections 1410 that enable communication between the vehicle 1402 and one or more other local or remote computing device(s). For instance, the communication connection(s) 1410 may facilitate communication with other local computing device(s) on the vehicle 1402 and/or the drive assembly(s) 1414. Also, the communication connection(s) 1410 may allow the vehicle to communicate with other nearby computing device(s) (e.g., remote computing device 1448, other nearby vehicles, etc.) and/or one or more remote sensor system(s) 1452 for receiving sensor data. The communications connection(s) 1410 also enable the vehicle 1402 to communicate with a remote teleoperations computing device or other remote services.

The communications connection(s) 1410 may include physical and/or logical interfaces for connecting the vehicle computer system 1404 to another computing device or a network, such as network(s) 1450. For example, the communications connection(s) 1410 can enable Wi-Fi-based communication such as via frequencies defined by the IEEE 1402.11 standards, short range wireless frequencies such as Bluetooth, cellular communication (e.g., 2G, 3G, 4G, 4G LTE, 5G, etc.) or any suitable wired or wireless communications protocol that enables the respective computing device to interface with the other computing device(s).

In at least one example, the vehicle 1402 may include one or more drive assembly(s) 1414. In some examples, the vehicle 1402 may have a single drive assembly 1414. In at least one example, if the vehicle 1402 has multiple drive assemblies 1414, individual drive assemblies 1414 may be positioned on opposite ends of the vehicle 1402 (e.g., the front and the rear, etc.). In at least one example, the drive assembly(s) 1414 may include one or more sensor systems to detect conditions of the drive assembly(s) 1414 and/or the surroundings of the vehicle 1402. By way of example and not limitation, the sensor system(s) may include one or more wheel encoders (e.g., rotary encoders) to sense rotation of the wheels of the drive assemblies, inertial sensors (e.g., inertial measurement units, accelerometers, gyroscopes, magnetometers, etc.) to measure orientation and acceleration of the drive assembly, cameras or other image sensors, ultrasonic sensors to acoustically detect objects in the surroundings of the drive assembly, lidar sensors, radar sensors, etc. Some sensors, such as the wheel encoders may be unique to the drive assembly(s) 1414. In some cases, the sensor system(s) on the drive assembly(s) 1414 may overlap or supplement corresponding systems of the vehicle 1402 (e.g., sensor system(s) 1406).

The drive assembly(s) 1414 may include many of the vehicle systems, including a high voltage battery, a motor to propel the vehicle, an inverter to convert direct current from the battery into alternating current for use by other vehicle systems, a steering system including a steering motor and steering rack (which can be electric), a braking system including hydraulic or electric actuators, a suspension system including hydraulic and/or pneumatic components, a stability control system for distributing brake forces to mitigate loss of traction and maintain control, a heating ventilation and cooling (HVAC) system (e.g., the HVAC system 1444), lighting (e.g., lighting such as head/tail lights to illuminate an exterior surrounding of the vehicle), and one or more other systems (e.g., cooling system, safety systems, onboard charging system, other electrical components such as a DC/DC converter, a high voltage junction, a high voltage cable, charging system, charge port, etc.). Additionally, the drive assembly(s) 1414 may include a drive assembly controller which may receive and preprocess data from the sensor system(s) and to control operation of the various vehicle systems. In some examples, the drive assembly controller may include one or more processors and memory communicatively coupled with the one or more processors. The memory may store one or more modules to perform various functionalities of the drive assembly(s) 1414. Furthermore, the drive assembly(s) 1414 may also include one or more communication connection(s) that enable communication by the respective drive assembly with one or more other local or remote computing device(s).

In at least one example, the direct connection 1412 may provide a physical interface to couple the one or more drive assembly(s) 1414 with the body of the vehicle 1402. For example, the direct connection 1412 may allow the transfer of energy, fluids, air, data, etc. between the drive assembly(s) 1414 and the vehicle. In some instances, the direct connection 1412 may further releasably secure the drive assembly(s) 1414 to the body of the vehicle 1402.

In at least one example, the localization component 1420, the perception component 1422, the planning component 1424, the one or more system controllers 1426, and the one or more maps 1428 may process sensor data, as described above, and may send their respective outputs, over the one or more network(s) 1450, to the computing device(s) 1448. In at least one example, the localization component 1420, the perception component 1422, the planning component 1424, the one or more system controllers 1426, and the one or more maps 1428 may send their respective outputs to the remote computing device(s) 1448 at a particular frequency, after a lapse of a predetermined period of time, in near real-time, etc.

In some examples, the vehicle 1402 may send sensor data to the computing device(s) 1448 via the network(s) 1450. In some examples, the vehicle 1402 may receive sensor data from the computing device(s) 1448 and/or remote sensor system(s) 1452 via the network(s) 1450. The sensor data may include raw sensor data and/or processed sensor data and/or representations of sensor data. In some examples, the sensor data (raw or processed) may be sent and/or received as one or more log files.

The computing device(s) 1448 may include processor(s) 1446 and a memory 1454 storing the map component 1456 and a sensor data processing component 1458. In some examples, the map component 1456 may include functionality to generate maps of various resolutions. In such examples, the map component 1456 may send one or more maps to the vehicle computer system 1404 for navigational purposes. In various examples, the sensor data processing component 1458 may be configured to receive data from one or more remote sensors, such as sensor system(s) 1406 and/or remote sensor system(s) 1452. In some examples, the sensor data processing component 1458 may be configured to process the data and send processed sensor data to the vehicle computer system 1404. In some examples, the sensor data processing component 1458 may be configured to send raw sensor data to the vehicle computer system 1404.

The processor(s) 1416 of the vehicle 1402 and the processor(s) 1446 of the computing device(s) 1448 may be any suitable processor capable of executing instructions to process data and perform operations as described herein. By way of example and not limitation, the processor(s) 1416 and 1446 may comprise one or more Central Processing Units (CPUs), Graphics Processing Units (GPUs), or any other device or portion of a device that processes electronic data to transform that electronic data into other electronic data that may be stored in registers and/or memory. In some examples, integrated circuits (e.g., ASICs, etc.), gate arrays (e.g., FPGAs, etc.), and other hardware devices may also be considered processors in so far as they are configured to implement encoded instructions.

Memory 1418 and memory 1454 are examples of non-transitory computer-readable media. The memory 1418 and memory 1454 may store an operating system and one or more software applications, instructions, programs, and/or data to implement the methods described herein and the functions attributed to the various systems. In various implementations, the memory may be implemented using any suitable memory technology, such as static random access memory (SRAM), synchronous dynamic RAM (SDRAM), nonvolatile/Flash-type memory, or any other type of memory capable of storing information. The architectures, systems, and individual elements described herein may include many other logical, programmatic, and physical components, of which those shown in the accompanying figures are merely examples that are related to the discussion herein.

In some instances, the memory 1418 and memory 1454 may include at least a working memory and a storage memory. For example, the working memory may be a high-speed memory of limited capacity (e.g., cache memory) that is used for storing data to be operated on by the processor(s) 1416 and 1446. In some instances, the memory 1418 and memory 1454 may include a storage memory that may be a lower-speed memory of relatively large capacity that is used for long-term storage of data. In some cases, the processor(s) 1416 and 1446 cannot operate directly on data that is stored in the storage memory, and data may need to be loaded into a working memory for performing operations based on the data, as discussed herein.

It should be noted that while FIG. 14 is illustrated as a distributed system, in alternative examples, components of the vehicle 1402 may be associated with the computing device(s) 1448 and/or components of the computing device(s) 1448 may be associated with the vehicle 1402. That is, the vehicle 1402 may perform one or more of the functions associated with the computing device(s) 1448, and vice versa.

Example Clauses

Any of the example clauses in this section may be used with any other of the example clauses and/or any of the other examples or embodiments described herein.

A: A vehicle comprising: a first drive assembly comprising a first heating ventilation and air conditioning system; a second drive assembly comprising a second heating ventilation and air conditioning system; a body coupled to the first drive assembly and the second drive assembly, the body comprising: a computer system; a first thermal coupling to transfer thermal energy between the first heating ventilation and air conditioning system and the computer system; and a second thermal coupling to transfer thermal energy between the second heating ventilation and air conditioning system and the computer system.

B: A vehicle as paragraph A describes, wherein the first thermal coupling comprises a first heat pipe, the second thermal coupling comprises a second heat pipe, the first heat pipe being different from the second heat pipe.

C: A vehicle as paragraphs A or B describe, wherein the first thermal coupling comprises a first fluid circuit and the second thermal coupling comprises a second fluid circuit, the first fluid circuit being separate from the second fluid circuit.

D: A vehicle as paragraphs A-C describe, wherein the first thermal coupling comprises a first fluid circuit and the second thermal coupling comprises a second fluid circuit, the first fluid circuit being in fluid communication with the second fluid circuit.

E: A vehicle as paragraphs A-D describe, wherein the first thermal coupling and the second thermal coupling comprise a single heat pipe or a set of heat pipes that extends between the first heating ventilation and air conditioning system, the second heating ventilation and air conditioning system, and the computer system.

F: A system comprising: a first heating ventilation and air conditioning system; a second heating ventilation and air conditioning system; a computer system; a first thermal coupling to transfer thermal energy between the first heating ventilation and air conditioning system and the computer system; and a second thermal coupling to transfer thermal energy between the second heating ventilation and air conditioning system and the computer system.

G: A system as paragraph F describes, wherein the first thermal coupling comprises a first heat pipe, the second thermal coupling comprises a second heat pipe, and the first heat pipe different from the second heat pipe.

H: A system as paragraphs F or G describe, wherein the first thermal coupling comprises a first fluid circuit and the second thermal coupling comprises a second fluid circuit, the first fluid circuit being separate from the second fluid circuit.

I: A system as paragraphs F-H describe, wherein the first thermal coupling comprises a first fluid circuit and the second thermal coupling comprises a second fluid circuit, the first fluid circuit being in fluid communication with the second fluid circuit.

J: A system as paragraphs F-I describe, wherein the first thermal coupling and the second thermal coupling comprise a single heat pipe or a set of heat pipes that extends between the first heating ventilation and air conditioning system, the second heating ventilation and air conditioning system, and the computer system.

K: A system as paragraphs F-J describe, further comprising: a first cooling block associated with a first component of the computer system, and a second cooling block associated with a second component of the computer system, the second component of the computer system different from the first component of the computer system.

L: A system as paragraphs F-K describe, wherein a location of the first cooling block or the second cooling block is outside the housing of the computer system.

M: A system as paragraphs F-L describe, wherein at least one of the first heating ventilation and air conditioning system or the second heating ventilation and air conditioning system is to control temperature or humidity inside a body of a vehicle.

N: A system as paragraphs F-M describe, wherein one of the first heating ventilation and air conditioning system or the second heating ventilation and air conditioning system is configured to cool the computer system via either the first thermal coupling or the second thermal coupling when the other of the first heating ventilation and air conditioning system or the second heating ventilation and air conditioning system is inoperable.

O: A system comprising: a first heating ventilation and air conditioning system; a second heating ventilation and air conditioning system; a vehicle computer system; and a thermal coupling to transfer thermal energy between the vehicle computer system and at least one of the first heating ventilation and air conditioning system or the second heating ventilation and air conditioning system.

P: A system as paragraph O describes, wherein the thermal coupling comprises a heat pipe and the first heating ventilation and air conditioning system and the second heating ventilation and air conditioning system are in thermal communication with the heat pipe.

Q: A system as paragraphs O or P describe, wherein the thermal coupling comprises a fluid circuit in fluid communication with the first heating ventilation and air conditioning system and the second heating ventilation and air conditioning system.

R: A system as paragraphs O-Q describe, wherein the thermal coupling is proximate to a component of the vehicle computer system.

S: A system as paragraphs O-R describe, wherein one of the first heating ventilation and air conditioning system or the second heating ventilation and air conditioning system is configured to cool the vehicle computer system via the thermal coupling when the other of the first heating ventilation and air conditioning system or the second heating ventilation and air conditioning system is inoperable.

T: A system as paragraph O-S describe, wherein the first heating ventilation and air conditioning system or the second heating ventilation and air conditioning system is to control temperature or humidity inside a body of a vehicle associated with the vehicle computer system.

While the example clauses described above are described with respect to one particular implementation, it should be understood that, in the context of this document, the content of the example clauses may also be implemented via a method, device, system, a computer-readable medium, and/or another implementation.

CONCLUSION

While one or more examples of the techniques described herein have been described, various alterations, additions, permutations and equivalents thereof are included within the scope of the techniques described herein.

In the description of examples, reference is made to the accompanying drawings that form a part hereof, which show by way of illustration specific examples of the claimed subject matter. It is to be understood that other examples can be used and that changes or alterations, such as structural changes, can be made. Such examples, changes or alterations are not necessarily departures from the scope with respect to the intended claimed subject matter. While the steps herein may be presented in a certain order, in some cases the ordering may be changed so that certain inputs are provided at different times or in a different order without changing the function of the systems and methods described. The disclosed procedures could also be executed in different orders. Additionally, various computations that are herein need not be performed in the order disclosed, and other examples using alternative orderings of the computations could be readily implemented. In addition to being reordered, the computations could also be decomposed into sub-computations with the same results.

What is claimed is:
1. A vehicle comprising:
a first drive assembly comprising a first heating ventilation and air conditioning system;
a second drive assembly comprising a second heating ventilation and air conditioning system;
a body coupled to the first drive assembly and the second drive assembly, the body comprising:
a computer system;
a first thermal coupling to transfer thermal energy between the first heating ventilation and air conditioning system and the computer system; and
a second thermal coupling to transfer thermal energy between the second heating ventilation and air conditioning system and the computer system, wherein at least one of the first heating ventilation and air conditioning system or the second heating ventilation and air conditioning system is configured to control temperature or humidity inside the body of the vehicle, and at least one of the first thermal coupling or the second thermal coupling extends between the first heating ventilation and air conditioning system, the second heating ventilation and air conditioning system, and the computer system.
2. The vehicle of claim 1, further comprising:
a first cooling block associated with a first component of the computer system, and
a second cooling block associated with a second component of the computer system, the second component of the computer system being different from the first component of the computer system.

3. The vehicle of claim 2, wherein a location of the first cooling block or the second cooling block is outside a housing of the computer system.

4. The vehicle of claim 1, wherein the first thermal coupling or the second thermal coupling is proximate to a component of the computer system.

5. The vehicle of claim 1, wherein one of the first heating ventilation and air conditioning system or the second heating ventilation and air conditioning system is configured to cool the computer system via either the first thermal coupling or the second thermal coupling when another of the first heating ventilation and air conditioning system or the second heating ventilation and air conditioning system is inoperable.

6. The vehicle of claim 1, wherein the at least one of the first thermal coupling or the second thermal coupling comprises a single heat pipe or a set of heat pipes.

7. A system comprising:
a first heating ventilation and air conditioning system;
a second heating ventilation and air conditioning system;
a computer system;
a first thermal coupling to transfer thermal energy between the first heating ventilation and air conditioning system and the computer system; and
a second thermal coupling to transfer thermal energy between the second heating ventilation and air conditioning system and the computer system, wherein at least one of the first thermal coupling or the second thermal coupling extends between the first heating ventilation and air conditioning system, the second heating ventilation and air conditioning system, and the computer system.

8. The system of claim 7, further comprising:
a first cooling block associated with a first component of the computer system, and
a second cooling block associated with a second component of the computer system, the second component of the computer system different from the first component of the computer system.

9. The system of claim 8, wherein a location of the first cooling block or the second cooling block is outside a housing of the computer system.

10. The system of claim 7, wherein at least one of the first heating ventilation and air conditioning system or the second heating ventilation and air conditioning system is to control temperature or humidity inside a body of a vehicle.

11. The system of claim 7, wherein one of the first heating ventilation and air conditioning system or the second heating ventilation and air conditioning system is configured to cool the computer system via either the first thermal coupling or the second thermal coupling when another of the first heating ventilation and air conditioning system or the second heating ventilation and air conditioning system is inoperable.

12. A system comprising:
a first heating ventilation and air conditioning system;
a second heating ventilation and air conditioning system;
a vehicle computer system; and
a thermal coupling to transfer thermal energy between the vehicle computer system and at least one of the first heating ventilation and air conditioning system or the second heating ventilation and air conditioning system, wherein the thermal coupling extends between the first heating ventilation and air conditioning system, the second heating ventilation and air conditioning system, and the vehicle computer system.

13. The system of claim 12, wherein the thermal coupling is proximate to a component of the vehicle computer system.

14. The system of claim 12, wherein one of the first heating ventilation and air conditioning system or the second heating ventilation and air conditioning system is configured to cool the vehicle computer system via the thermal coupling when another of the first heating ventilation and air conditioning system or the second heating ventilation and air conditioning system is inoperable.

15. The system of claim 12, wherein the first heating ventilation and air conditioning system or the second heating ventilation and air conditioning system is to control temperature or humidity inside a body of a vehicle associated with the vehicle computer system.

16. The system of claim 12, wherein the thermal coupling comprises a single heat pipe or a set of heat pipes.

17. The system of claim 12, further comprising:
a first cooling block associated with a first component of the vehicle computer system, and
a second cooling block associated with a second component of the vehicle computer system, the second component of the vehicle computer system different from the first component of the vehicle computer system.

18. The system of claim 17, wherein a location of the first cooling block or the second cooling block is outside a housing of the vehicle computer system.

19. The system of claim 12, wherein the thermal coupling comprises a first thermal coupling and a second thermal coupling.

20. The system of claim 19, wherein the first thermal coupling comprises a first heat pipe, the second thermal coupling comprises a second heat pipe, and the first heat pipe is different from the second heat pipe.

* * * * *